United States Patent
Kim et al.

(10) Patent No.: US 11,594,287 B2
(45) Date of Patent: Feb. 28, 2023

(54) NONVOLATILE MEMORY DEVICE AND STORAGE DEVICE INCLUDING THE NONVOLATILE MEMORY DEVICE

(71) Applicant: Samsung Electronics Co., Ltd., Suwon-si (KR)

(72) Inventors: Tongsung Kim, Seongnam-si (KR); Youngmin Jo, Hwaseong-si (KR); Chiweon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/198,382

(22) Filed: Mar. 11, 2021

(65) Prior Publication Data

US 2022/0044741 A1    Feb. 10, 2022

(30) Foreign Application Priority Data

Aug. 7, 2020    (KR) .................. 10-2020-0099248

(51) Int. Cl.
  *G11C 16/32*     (2006.01)
  *G11C 16/04*     (2006.01)
  *H01L 25/065*    (2023.01)

(52) U.S. Cl.
  CPC .......... *G11C 16/32* (2013.01); *G11C 16/0483* (2013.01); *H01L 25/0657* (2013.01); *H01L 2225/06506* (2013.01)

(58) Field of Classification Search
  CPC ..... G11C 16/32; G11C 16/0483; G11C 7/222; G11C 2207/2254; G11C 29/028; G11C 29/12015; G11C 29/023; H01L 25/0657; H01L 2225/06506
  See application file for complete search history.

(56) References Cited

U.S. PATENT DOCUMENTS

| | | | |
|---|---|---|---|
| 6,748,549 B1 * | 6/2004 | Chao ............... | G01R 31/31937 365/194 |
| 7,177,205 B2 | 2/2007 | Kennedy et al. | |
| 7,487,481 B2 | 2/2009 | Feng | |
| 7,697,371 B2 | 4/2010 | Chen et al. | |
| 8,407,441 B2 | 3/2013 | Giovannini et al. | |
| 10,511,312 B1 | 12/2019 | Pastorello et al. | |

(Continued)

FOREIGN PATENT DOCUMENTS

JP    2015-179380 A    10/2015

OTHER PUBLICATIONS

Extended European Search Report dated Oct. 5, 2021 issued in corresponding European Appln. No. 21172226.9.

*Primary Examiner* — Jay W. Radke
(74) *Attorney, Agent, or Firm* — Harness, Dickey & Pierce, P.L.C.

(57) ABSTRACT

A nonvolatile memory device includes a first memory chip and a second memory chip connected to a controller through the same channel. The first memory chip generates a first signal from a first internal clock signal based on a clock signal received from the controller. The second memory chip generates a second signal from a second internal clock signal based on the clock signal, and performs a phase calibration operation on the second signal on the basis of a phase of the first signal by delaying the second internal clock signal based on a phase difference between the first and second signals.

20 Claims, 24 Drawing Sheets

(56) References Cited

U.S. PATENT DOCUMENTS

| | | | |
|---|---|---|---|
| 2004/0022095 A1* | 2/2004 | Lee | G11C 7/1051 |
| | | | 365/200 |
| 2009/0161475 A1 | 6/2009 | Kim et al. | |
| 2012/0146693 A1* | 6/2012 | Lee | H03L 7/0814 |
| | | | 327/158 |
| 2019/0317699 A1 | 10/2019 | Hong | |
| 2019/0371376 A1 | 12/2019 | Kim | |

* cited by examiner

NONVOLATILE MEMORY DEVICE AND STORAGE DEVICE INCLUDING THE NONVOLATILE MEMORY DEVICE

CROSS-REFERENCE TO RELATED APPLICATION

This application is based on and claims priority under 35 U.S.C. § is based on and claims priority under 10-2020-0099248, filed on Aug. 7, 2020, in the Korean Intellectual Property Office, the disclosure of which is incorporated by reference herein in its entirety.

BACKGROUND

The inventive concepts provide memory devices, and more particularly to, nonvolatile memory devices including a plurality of memory chips and storage devices including the nonvolatile memory devices.

A storage device may include a nonvolatile memory and a controller controlling the nonvolatile memory. In the related art, communication between the nonvolatile memory and the controller is performed at a low operation frequency compared to a memory system including a high-speed memory such as dynamic random access memory (DRAM) or static random access memory (SRAM). However, communication between the nonvolatile memory and the controller has been recently required to be performed at a high operation frequency.

SUMMARY

According to an aspect of the inventive concepts, there is provided a nonvolatile memory device including a first memory chip configured to generate a first signal from a first internal clock signal based on a clock signal received from a controller; and a second memory chip configured to generate a second signal from a second internal clock signal based on the clock signal, and perform a phase calibration operation on the second signal with respect to a phase of the first signal by delaying the second internal clock signal based on a phase difference between the first and second signals, wherein the first and second memory chips are connected to the controller through the same channel.

According to another aspect of the inventive concepts, there is provided a storage device including a first memory chip configured to generate a first signal from a first internal clock signal based on a first clock signal received; a second memory chip configured to generate a second signal from a second internal clock signal based on a second clock signal; and a controller connected to the first memory chip through a first channel, connected to the second memory chip through a second channel, and delay the second clock signal based on a phase difference between the first and second signals to perform a phase calibration operation on the second signal on the basis of a phase of the first signal.

According to another aspect of the inventive concepts, there is provided a nonvolatile memory device including a first memory chip configured to generate a first signal from a first internal clock signal based on a clock signal received from a controller; and a second memory chip configured to generate a second signal from a second internal clock signal based on the clock signal, and perform a phase calibration operation on the second signal on the basis of a phase of the first signal by delaying the second internal clock signal based on a phase difference between the first and second signals, wherein the second memory chip includes a memory cell region including a first metal pad; and a peripheral circuit region includes a second metal pad and vertically connected to the memory cell region by the first metal pad and the second metal pad, and wherein the peripheral circuit region includes a delay circuit configured to delay the clock signal to generate the second internal clock signal; and a phase detector configured to detect the phase difference between the first and second signals, and generate a third signal having a duty ratio according to the detected phase difference or a logic high level or a logic low level according to the detected phase difference.

According to another aspect of the inventive concepts, there is provided a nonvolatile memory device including a buffer chip configured to generate a first clock signal and a second clock signal from a clock signal received from a controller; a first memory chip configured to generate a first signal from a first internal clock signal based on the first clock signal; and a second memory chip configured to generate a second signal from a second internal clock signal based on the second clock signal, and wherein the buffer chip is configured to perform a phase calibration operation on the second signal on the basis of a phase of the first signal by delaying the second clock signal based on a phase difference between the first and second signals.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
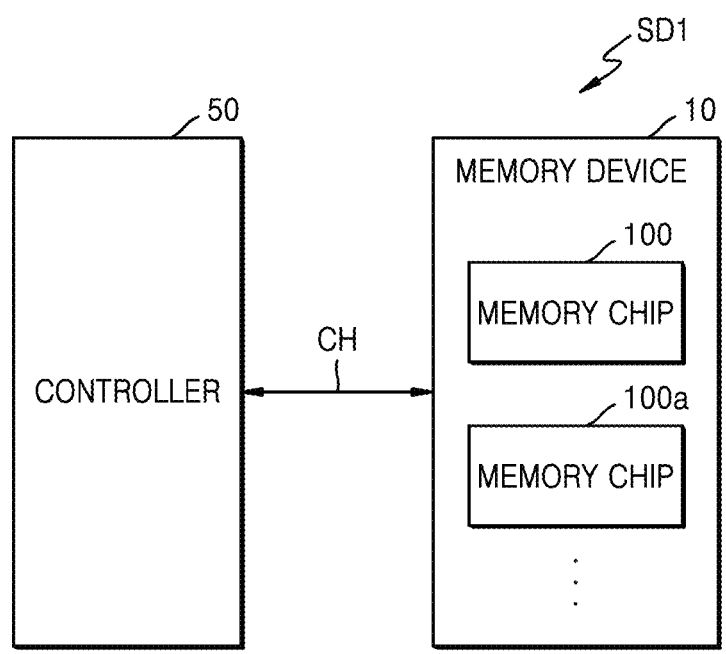
FIG. 1 is a block diagram schematically illustrating a storage device according to example embodiments of the inventive concepts.

FIG. 1 is a block diagram schematically illustrating a storage device SD1 according to example embodiments of the inventive concepts.

Referring to FIG. 1, the storage device SD1 may include a memory device 10 and a controller 50. The memory device 10 may be a nonvolatile memory device including first and second memory chips 100 and 100a. The first and second memory chips 100 and 100a may be connected to the controller 50 through a same channel CH, and accordingly, may transmit and receive data to and from the controller 50 through the same channel CH.

The memory device 10 may include a plurality of memory chips including at least the first and second memory chips 100 and 100a, and accordingly, may be referred to as a 'multi-chip memory'. For example, each of the first and second memory chips 100 and 100a may be a dual die package (DDP) or a quadruple die package (QDP). However, the inventive concepts are not limited thereto. In some example embodiments, the memory device 10 may be implemented as a multi-die package including a plurality of memory dies including at least a first memory die and a second memory die. The description of the first and second memory chips 100 and 100a provided below may be equally applied to the first and second memory dies.

When the memory device 10 is implemented as a multi-chip memory, the first and second memory chips 100 and 100a may operate simultaneously. For example, the controller 50 may simultaneously control read operations on the first and second memory chips 100 and 100a. As a data input-output speed between the controller 50 and the memory device 10 increases, a request for a phase alignment between the first and second memory chips 100 and 100a may increase.

According to example embodiments, the second memory chip 100a may align phases of first and second signals respectively generated by the first and second memory chips 100 and 100a connected to the same channel CH by performing a phase calibration operation with respect to or on the basis of the first memory chip 100, thereby improving the performance and reliability of the memory device 10. In addition, the memory device 10 may reduce the time required for the phase calibration operation by performing a duty correction operation and the phase calibration operation together in a training period, for example, a duty correction circuit (DCC) training period.

In some example embodiments, the first and second memory chips 100 and 100a may be nonvolatile memory chips. For example, the first and second memory chips 100 and 100a may be NAND flash memory chips. For example, at least one of the first and second memory chips 100 and 100a may be a vertical NAND (VNAND) flash memory chip. The vertical NAND flash memory chip may include word lines stacked on a substrate in a vertical direction and cell strings respectively including a plurality of memory cells respectively connected to the word lines. However, the inventive concepts are not limited thereto, and at least one of the first and second memory chips 100 and 100a may be resistive memory chips such as resistive RAM (ReRAM), phase change RAM (PRAM), and magnetic RAM (MRAM).

In some example embodiments, the storage device SD1 may be an internal memory embedded into an electronic device. For example, the storage device SD1 may be an SSD, an embedded Universal Flash Storage (UFS) memory device, or an embedded Multi-Media Card (eMMC). In some example embodiments, the storage device SD1 may be an external memory detachable from the electronic device. For example, the storage device SD1 may be a UFS memory card, a Compact Flash (CF) memory card, Secure Digital (SD), a Micro Secure Digital (Micro-SD) memory card, Mini Secure Digital (Mini-SD), an extreme digital (xD) memory card, or a memory stick.

Figure 2:
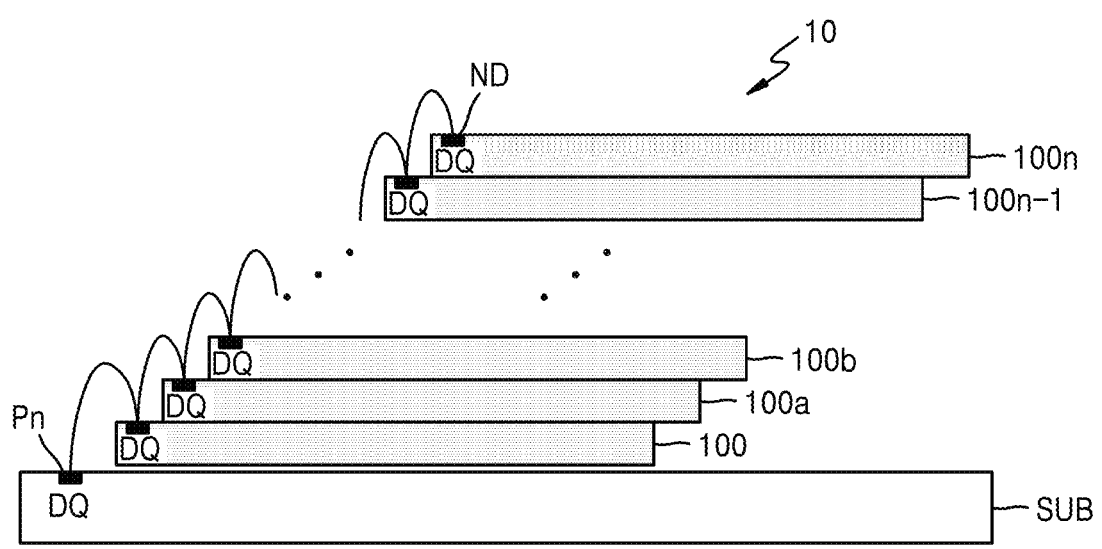
FIG. 2 illustrates a memory device of FIG. 1.

FIG. 2 illustrates the memory device 10 of FIG. 1.

Referring to FIG. 2, the memory device 10 may include a substrate SUB and a plurality of memory chips 100 to 100n. The plurality of memory chips 100 to 100n may be vertically stacked on the substrate SUB. Input-output pins Pn may be disposed on the substrate SUB, and input-output nodes ND of the plurality of memory chips 100 to 100n may be connected to an input-output pin Pn. For example, the input-output pin Pn and the input-output nodes ND may be connected to each other by wire bonding. In this regard, for wire bonding, the plurality of memory chips 100 to 100n may be stacked to have a skew in the horizontal direction.

Figure 3:
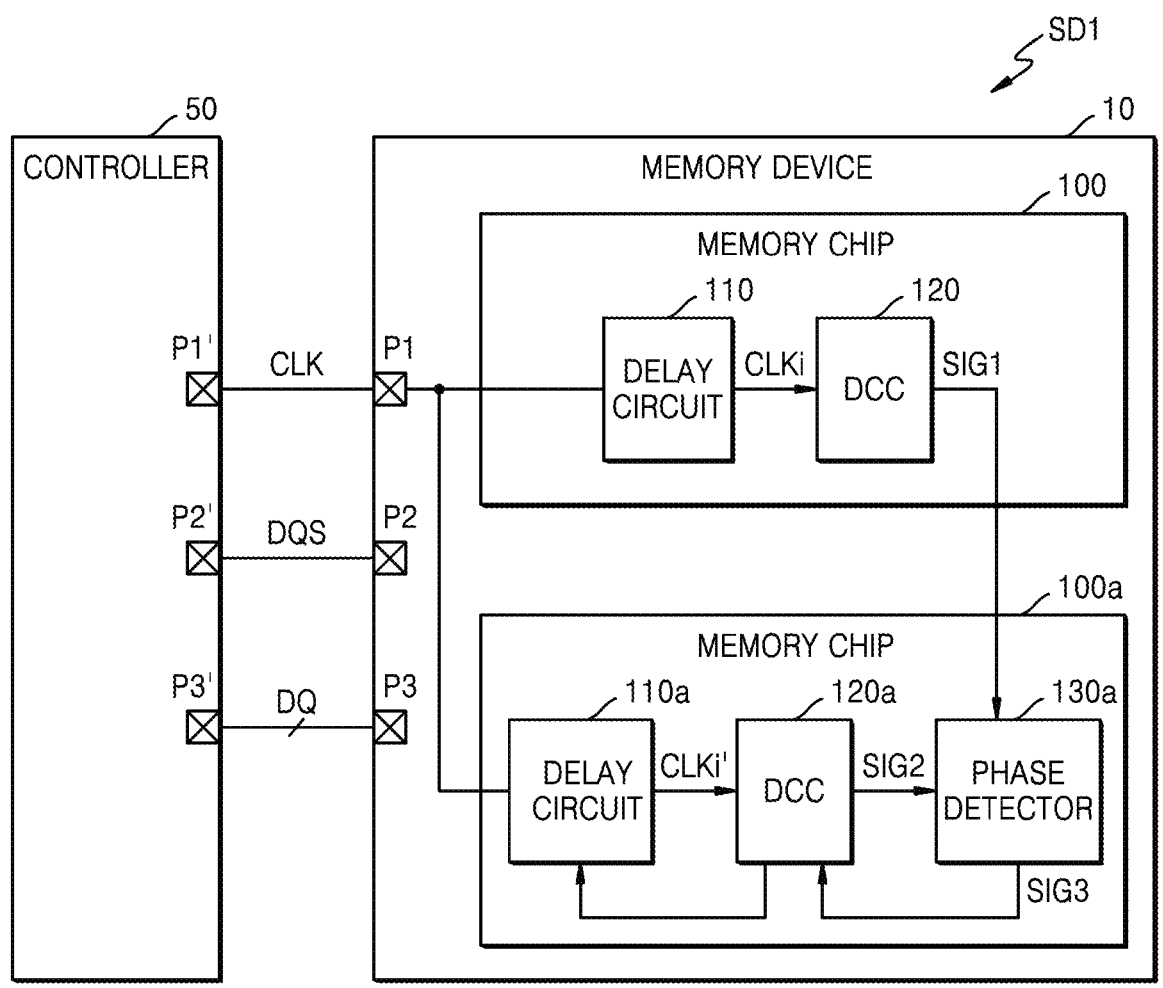
FIG. 3 illustrates the storage device of FIG. 1 in more detail.

FIG. 3 illustrates the storage device SD1 of FIG. 1 in more detail.

Referring to FIG. 3, the memory device 10 may include first and second memory chips 100 and 100a, and first to third pins P1 to P3. The first and second memory chips 100 and 100a may be commonly connected to each of the first to third pins P1 to P3. The controller 50 may include first to third pins P1' to P3'. The first to third pins P1' to P3' may be connected to the first to third pins P1 to P3, respectively.

The memory device 10 may receive a clock signal CLK from the controller 50 through the first pin P1, and transmit and receive a data strobe signal DQS to and from the controller 50 through the second pin P2. Also, the memory device 10 may receive a command and an address from the controller 50 through the third pins P3 and may transmit and receive data DQ to and from the controller 50 through the third pins P3. For example, the third pins P3 may include 8 input-output pins, but the inventive concepts are not limited thereto. In this regard, signal lines through which the clock signal CLK, the data strobe signal DQS, and the data DQ are transmitted/received may constitute the channel CH of FIG. 1.

During a read operation on the memory device 10, the memory device 10 may receive the clock signal CLK, for example, a read enable signal nRE, and output the data strobe signal DQS and the data DQ. In a double data rate (DDR) mode, the data DQ may be sequentially output in synchronization with a rising edge and a falling edge of the data strobe signal DQS. Therefore, data windows of the first and second data that are sequentially output may correspond to a logic high period and a logic low period of the data strobe signal DQS, respectively. At this time, because the data strobe signal DQS is generated based on a clock signal CLK, the data windows of the first and second data may be determined according to a ratio of the logic high period and the logic low period of the clock signal CLK.

When a "duty mismatch" occurs in the clock signal CLK, the logic high period may be different from the logic low period of the clock signal CLK, that is, the ratio between the logic high period and the logic low period may not be 1:1. At this time, the first and second data may have different data windows, effective data windows of the first and second data may decrease, and as a result, the performance of the memory device 10 may deteriorate. Accordingly, there is a need for a method of securing an effective data window by performing duty correction based on the clock signal CLK in order to eliminate the duty mismatch of the clock signal CLK.

The first memory chip 100 may generate a first signal SIG1 from a first internal clock signal CLKi based on the clock signal CLK. For example, the first memory chip 100 may include a delay circuit 110 and a duty correction circuit (DCC) 120. The delay circuit 110 may generate a first internal clock signal CLKi from the clock signal CLK received through the first pin P1. The DCC 120 may generate the first signal SIG1 by performing a first duty correction operation on the first internal clock signal CLKi.

The second memory chip 100a may generate a second signal SIG2 from a second internal clock signal CLKi' based on the clock signal CLK. For example, the second memory chip 100a may include a delay circuit 110a and a DCC 120a. The delay circuit 110a may generate the second internal clock signal CLKi' from the clock signal CLK received through the first pin P1. The DCC 120a may generate the second signal SIG2 by performing a second duty correction operation on the second internal clock signal CLKi'.

In some example embodiments, the second memory chip 100a may further include a delay locked loop (DLL) circuit, and the second memory chip 100a may perform a phase calibration operation using a DLL of the DLL circuit. For example, the DLL circuit of the second memory chip 100a may receive the first and second signals SIG1 and SIG2, and may control the delay circuit 110a based on a phase difference between the first and second signals SIG1 and SIG2. Accordingly, the second memory chip 100a may delay the second internal clock signal CLKi', and phases of the first and second signals SIG1 and SIG2 may be aligned. At this time, the second memory chip 100a may perform the phase calibration operation together with a DLL training operation in a training period, for example, a DLL training period.

Figure 4:
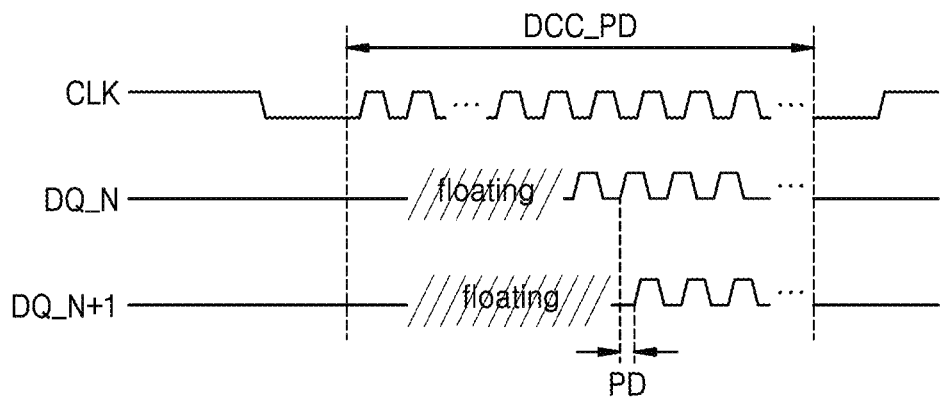
FIG. 4 is a timing diagram illustrating a duty correction operation and a phase calibration operation performed by the storage device of FIG. 3.

FIG. 4 is a timing diagram illustrating a duty correction operation and a phase calibration operation performed by the storage device SD1 of FIG. 3.

Referring to FIGS. 3 and 4 together, because the memory device 10 is an asynchronous system and does not always have a toggling signal, the DCCs 120 and 120a may perform the duty correction operation only in a period in which the clock signal CLK is applied. In some example embodiments, the memory device 10 may perform the duty correction operation by using a read enable signal nRE as the clock signal CLK. When the duty correction operation is performed in a readout period in which read data is output among a read period in which a read operation on the memory device 10 is performed, a clock duty may change for each clock cycle by the duty correction operation, and as a result, an effective data window of the read data may be reduced.

Accordingly, in some example embodiments, the DCCs 120 and 120a may perform the duty correction operation in a dedicated period other than the readout period. Hereinafter, the dedicated period of the duty correction operation will be referred to as "DCC training period DCC_PD", and operations of the DCCs 120 and 120a performed in the DCC training period DCC_PD will be referred to as "DCC training". In an embodiment, the "DCC training period DCC_PD" may include a previously determined number of clock cycles. During the DCC training period DCC_PD, the clock signal CLK, for example, the read enable signal nRE, may be toggled at a previously determined frequency regardless of operations of output buffers (e.g., 143 and 243 in FIG. 19).

In some example embodiments, in the DCC training period DCC_PD, the first memory chip 100 may provide the first signal SIG1 to an Nth input-output pad DQ_N as a result of performing the first duty correction operation. The Nth input-output pad DQ_N may be connected to one of the third input-output pins P3. In addition, in the DCC training period DCC_PD, the second memory chip 100a may provide the second signal SIG2 to an N+1th input-output pad DQ_N+1 or an N−1th input-output pad DQ_N−1 as a result of performing the second duty correction operation. The N+1th input-output pad DQ_N+1 or the N−1th input-output pad DQ_N−1 may be connected to the other one of the third input-output pins P3. At this time, a phase difference PD may occur between the first signal SIG1 and the second signal SIG2. To improve the reliability of the memory device 10 when the first and second memory chips 100 and 100a operate simultaneously, it is necessary to remove the phase difference PD.

Accordingly, the second memory chip 100a may further include a phase detector 130a. The phase detector 130a may detect the phase difference PD of the first signal SIG1 provided to the Nth input-output pad DQ_N from the first memory chip 100 and the second signal SIG2 provided to the N+1th input-output pad DQ_N+1 from the second memory chip 100a, thereby generating a third signal SIG3 and providing the generated third signal SIG3 to the DCC 120a. The DCC 120a may generate a control signal by performing the duty correction operation on the third signal SIG3 and provide the generated control signal to the delay circuit 110a. Accordingly, the delay circuit 110a may generate the second internal clock signal CLKi' by delaying the clock signal CLK according to the control signal.

In this specification, the first memory chip 100 may be referred to as a 'reference chip', and the second memory chip 100a may be referred to as a 'target chip'. The second memory chip 100a may perform the phase calibration operation with respect to or on the basis of the phase of the first signal SIG1, that is, the reference signal, generated from the first memory chip 100 that is the reference chip. The configurations of the first and second memory chips 100 and 100a may be the same or substantially the same, and although not illustrated, the first memory chip 100 may also include a phase detector. Accordingly, in some example embodiments, the first memory chip 100 may be used as the target chip and the second memory chip 100a may be used as the reference chip. In some example embodiments, the first memory chip 100 may perform the phase calibration operation with respect to or on the basis of the phase of the second signal SIG2 generated in the second memory chip 100a.

Figure 5:
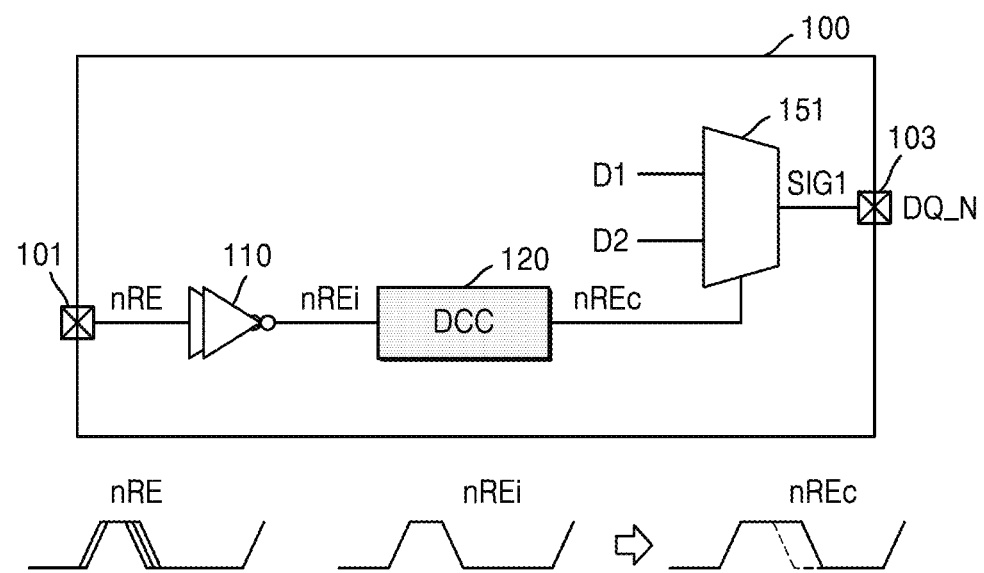
FIG. 5 is a block diagram illustrating a duty correction operation of a first memory chip according to example embodiments of the inventive concepts.

FIG. 5 is a block diagram illustrating a duty correction operation of the first memory chip 100 according to example embodiments of the inventive concepts.

Referring to FIG. 5, the first memory chip 100 may include the delay circuit 110, the DCC 120, and a multiplexer 151. The delay circuit 110 may receive the read enable signal nRE through a first pad 101 and generate a first internal read enable signal nREi based on the received read enable signal nRE. For example, the delay circuit 110 may include a plurality of inverters. When a duty mismatch occurs in the read enable signal nRE, the duty mismatch may also occur in the first internal read enable signal nREi. Even when the duty mismatch does not occur in the read enable signal nRE, the duty mismatch may occur in the first internal read enable signal nREi while undergoing the delay circuit 110.

The DCC 120 may generate a first corrected read enable signal nREc by performing a first duty correction operation on the first internal read enable signal nREi. The DCC 120 may remove the duty mismatch occurring in the first internal read enable signal nREi, and accordingly, a duty ratio of the first corrected read enable signal nREc may be 1:1. According to some example embodiments, the DCC 120 may have various configurations for performing the first duty correction operation. The configuration and operation of the DCC 120 described herein are examples, and the inventive concepts are not limited thereto.

The multiplexer 151 may receive first and second internal data D1 and D2, and generate the first signal SIG1 from the first and second internal data D1 and D2 according to the first corrected read enable signal nREc. The generated first signal SIG1 may be output to an Nth input-output pad 103. The multiplexer 151 may generate the first signal SIG1 by outputting the first internal data D1 in a logic high period of the first corrected read enable signal nREc, and outputting the second internal data D2 in a logic low period of the first corrected read enable signal nREc.

In some example embodiments, the first memory chip 100 may further include a random data generator, and the first and second internal data D1 and D2 may be generated by the random data generator. In some example embodiments, the first memory chip 100 may further include a register, and the first and second internal data D1 and D2 may be data previously stored in the register. For example, the first internal data D1 may be a logic '1', and the second internal data D2 may be a logic '0'. In some example embodiments, during a training period, that is, upon a phase calibration operation, the first internal data D1 may be fixed to logic '1' (for example, a power supply voltage VDD), and the second internal data D2 may be fixed to logic '0' (for example, a ground voltage GND).

Figure 6:
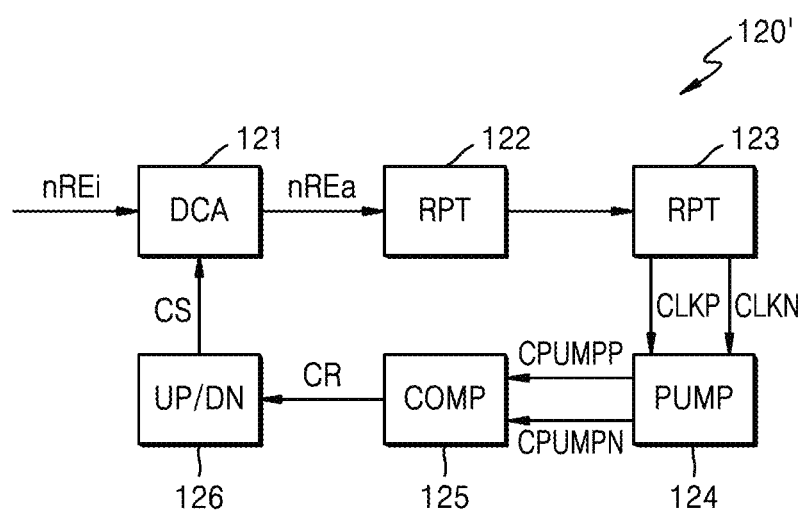
FIG. 6 is a block diagram schematically illustrating a duty correction circuit (DCC) according to example embodiments of the inventive concepts.

FIG. 6 is a block diagram schematically illustrating a DCC 120' according to example embodiments of the inventive concepts.

Referring to FIG. 6, the DCC 120' may correspond to an example of the DCC 120 of FIG. 5. The DCC 120' may include a duty cycle adjustment (DCA) circuit 121, first and second repeaters RPT 122 and 123, a charge pump 124, a comparator COMP 125, and an up/down counter 126. The DCA circuit 121 may generate an adjusted read enable signal nREa by adjusting a duty cycle of the internal read enable signal nREi.

The first repeater RPT 122 may receive the adjusted read enable signal nREa. The second repeater RPT 123 may output first and second clock signals CLKP and CLKN from the output of the first repeater RPT 122. Each of the first and second clock signals CLKP and CLKN may have a duty ratio based on the adjusted read enable signal nREa. The second clock signal CLKN may have an inverted phase with respect to the first clock signal CLKP. However, the inventive concepts are not limited thereto. In some example embodiments, the second repeater RPT 123 may output a clock signal and a reference signal based on the adjusted read enable signal nREa.

The charge pump 124 may generate first and second charge pump signals CPUMPP and CPUMPN, respectively, from the first and second clock signals CLKP and CLKN through charge pumping. For example, the first charge pump signal CPUMPP may increase in a logic high period of the first clock signal CLKP and may decrease in a logic low period of the first clock signal CLKP. Likewise, the second charge pump signal CPUMPN may increase in the logic high period of the second clock signal CLKN and decrease in the logic low period of the second clock signal CLKN. Accordingly, when a duty mismatch occurs in the first and second clock signals CLKP and CLKN, the logic high period is relatively long in the first clock signal CLKP, and the logic high period is relatively short in the second clock signal CLKN, after the number of clock cycles of the first and second clock signals CLKP and CLKN, the first charge pump signal CPUMPP may increase, whereas the second charge pump signal CPUMPN may decrease.

The comparator 125 may compare the first and second charge pump signals CPUMPP and CPUMPN, and generate a comparison result signal CR. For example, when the first charge pump signal CPUMPP is greater than the second charge pump signal CPUMPN, the comparator 125 may generate the comparison result signal CR as logic high, and when the first charge pump signal CPUMPP is not greater than the second charge pump signal CPUMPN, the comparator 125 may generate the comparison result signal CR as logic low. The up/down counter 126 may generate a control signal CS from the comparison result signal CR. For example, the control signal CS may be generated as a 4-bit digital code, when the comparison result signal CR is logic high, the up/down counter 126 may increase a code of the control signal CS by 1, and when the comparison result signal CR is logic low, the up/down counter 126 may decrease the code of the control signal CS by 1.

Figure 7:
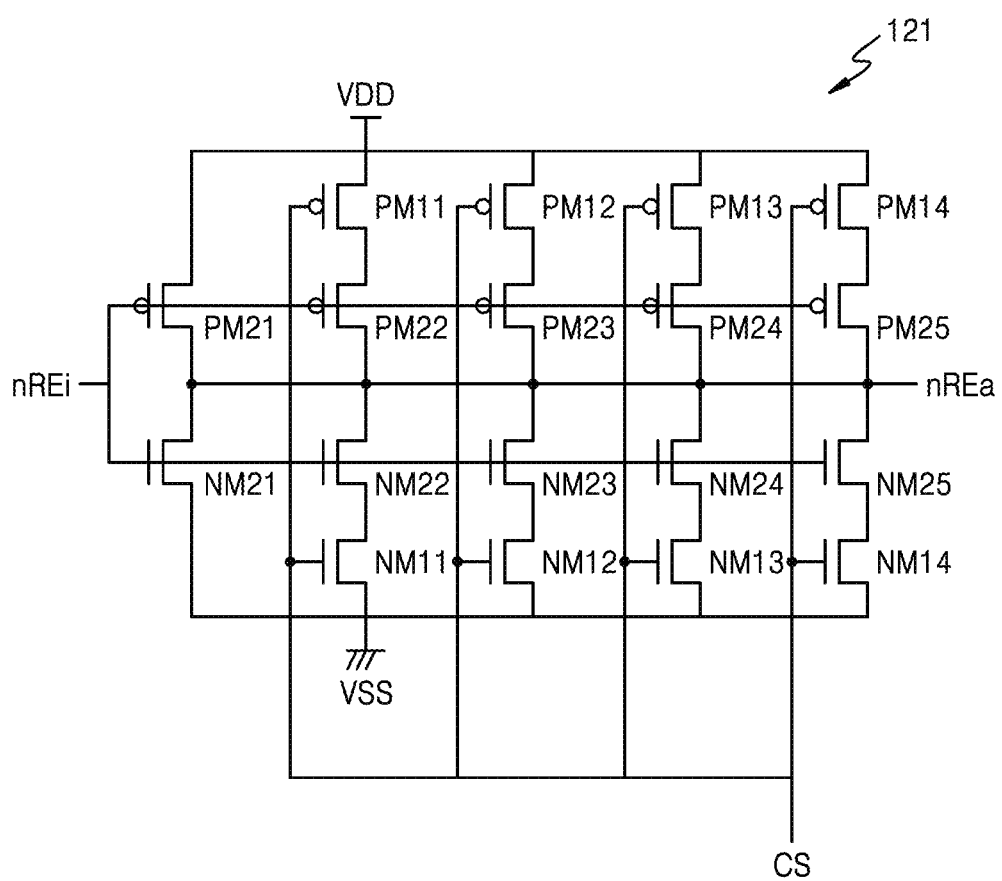
FIG. 7 is a circuit diagram illustrating a duty cycle adjustment (DCA) circuit of FIG. 6.

FIG. 7 is a circuit diagram illustrating the DCA circuit 121 of FIG. 6.

Referring to FIG. 7, the DCA circuit 121 may include first PMOS transistors PM11 to PM14, second PMOS transistors PM21 to PM25, first NMOS transistors NM11 to NM14, and second NMOS transistors NM21 to NM25. The first PMOS transistors PM11 to PM14 may be commonly connected to the power supply voltage terminal VDD. The first NMOS transistors NM11 to NM14 may be commonly connected to a ground voltage terminal VSS. The first PMOS transistors PM11 to PM14 and the first NMOS transistors NM11 to NM14 may be driven by the control signal CS. The second PMOS transistors PM21 to PM25 and the second NMOS transistors NM21 to NM25 may be driven by the internal read enable signal nREi.

For example, the control signal CS may be a 4-bit digital code. For example, when the code of the control signal CS increases by 1, some of the first PMOS transistors PM11 to PM14 may be turned off, and some of the first NMOS transistors NM11 to NM14 may be turned on. Accordingly, a logic high period of the adjusted internal read signal nREa may be reduced compared to the internal read signal nREi. For example, when the code of the control signal CS decreases by 1, some of the first PMOS transistors PM11 to PM14 may be turned on, and some of the first NMOS transistors NM11 to NM14 may be turned off. Accordingly, the logic high period of the adjusted internal read signal nREa may increase compared to the internal read signal nREi.

Figure 8:
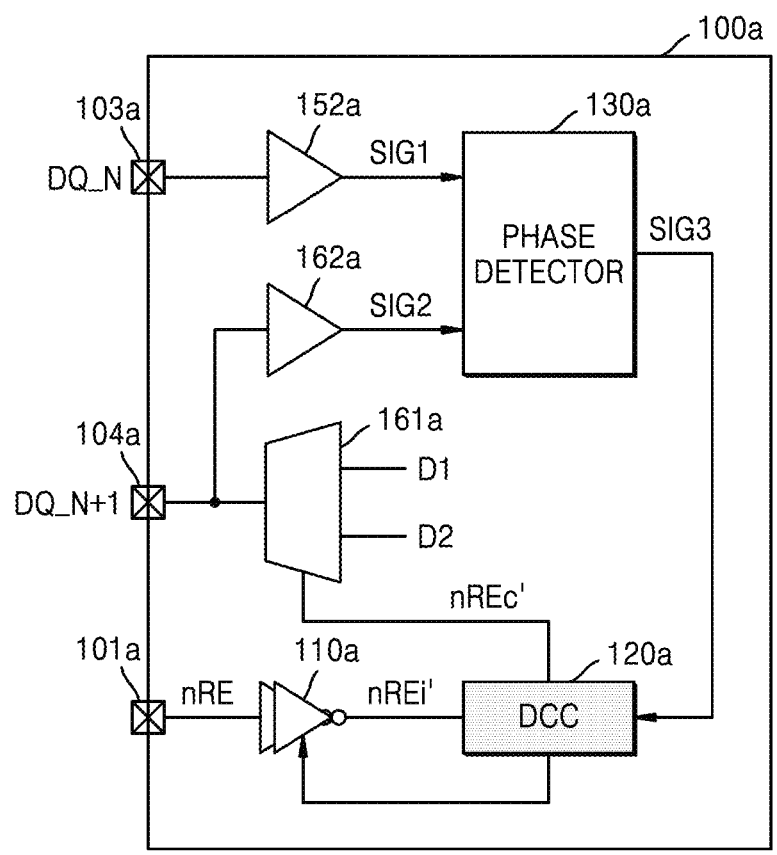
FIG. 8 is a block diagram illustrating a duty correction operation and a phase calibration operation of a second memory chip according to example embodiments of the inventive concepts.

FIG. 8 is a block diagram illustrating a duty correction operation and a phase calibration operation of the second memory chip 100a according to example embodiments of the inventive concepts.

Referring to FIG. 8, the second memory chip 100a may include the delay circuit 110a, the DCC 120a, a phase detector 130a, a multiplexer 161a, and first and second input buffers 152a and 162a. The delay circuit 110a may receive the read enable signal nRE through a first pad 101a, and generate a second internal read enable signal nREi' based on the received read enable signal nRE. For example, the delay circuit 110a may include a plurality of inverters. The delay circuit 110a may be implemented substantially similar to the delay circuit 110 of the first memory chip 100. Nevertheless, for reasons such as a process variation with respect to the first memory chip 100 and the second memory chip 100a, or a process variation with respect to the delay circuit 110 and the delay circuit 110a, a phase difference may occur between the first internal read enable signal nREi and the second internal read enable signal nREi'.

The DCC 120a may generate a second corrected read enable signal nREc' by performing a second duty correction operation on the second internal read enable signal nREi'. The multiplexer 161a may receive the first and second internal data D1 and D2 and generate the second signal SIG2 from the first and second internal data D1 and D2 according to the second corrected read enable signal nREc'. The generated second signal SIG2 may be output to an N+1th input-output pad 104a. The DCC 120a and the multiplexer 161a may be implemented substantially similar to the DCC 120 and the multiplexer 151 of FIG. 5, respectively, and the description provided above with reference to FIG. 5 may also be applied to the present example embodiment.

The first and second input buffers 152a and 162a may be connected to an Nth input-output pad 103a and the N+1th input-output pad 104a, respectively. For example, the first input buffer 152a may buffer the first signal SIG1 received from the first memory chip 100 through the N-th input-output pad 103a, and output the buffered first signal SIG1 to the phase detector 130a. The second input buffer 162a may buffer the second signal SIG2 provided to the N+1th input-output pad 104a and output the buffered second signal SIG2 to the phase detector 130a. The phase detector 130a may generate the third signal SIG3 based on the phase difference between the first and second signals SIG1 and SIG2, and provide the generated third signal SIG3 to the DCC 120a.

Figure 9:
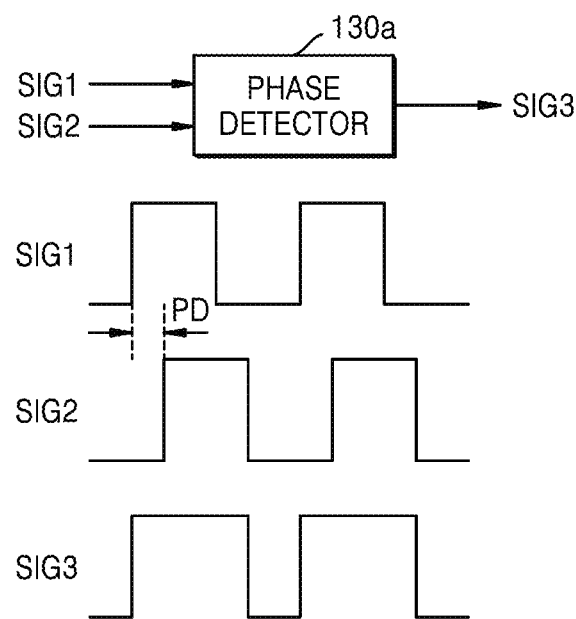
FIG. 9 is a timing diagram illustrating an operation of a phase detector of FIG. 8 according to example embodiments of the inventive concepts.

FIG. 9 is a timing diagram illustrating an operation of the phase detector 130a of FIG. 8 according to example embodiments of the inventive concepts.

Referring to FIG. 9, the phase difference PD may occur between the first signal SIG1 and the second signal SIG2, and accordingly, a time difference between a rising edge of the first signal SIG1 and a rising edge of the second signal SIG2 may occur. The phase detector 130a may generate the third signal SIG3 having a logic high level in a logic high period of the first signal SIG1 or a logic high period of the second signal SIG2. For example, the phase detector 130a may include an OR gate, and accordingly, as the phase difference PD between the first signal SIG1 and the second signal SIG2 increases, the logic high period of the third signal SIG3 may increase, and a duty ratio of the third signal SIG3 may increase. As described above, the phase detector 130a may convert the phase difference PD between the first signal SIG1 and the second signal SIG2 into the duty of the third signal SIG3. The third signal SIG3 may have a duty ratio or a duty cycle based on the phase difference PD between the first and second signals SIG1 and SIG2.

Figure 10:
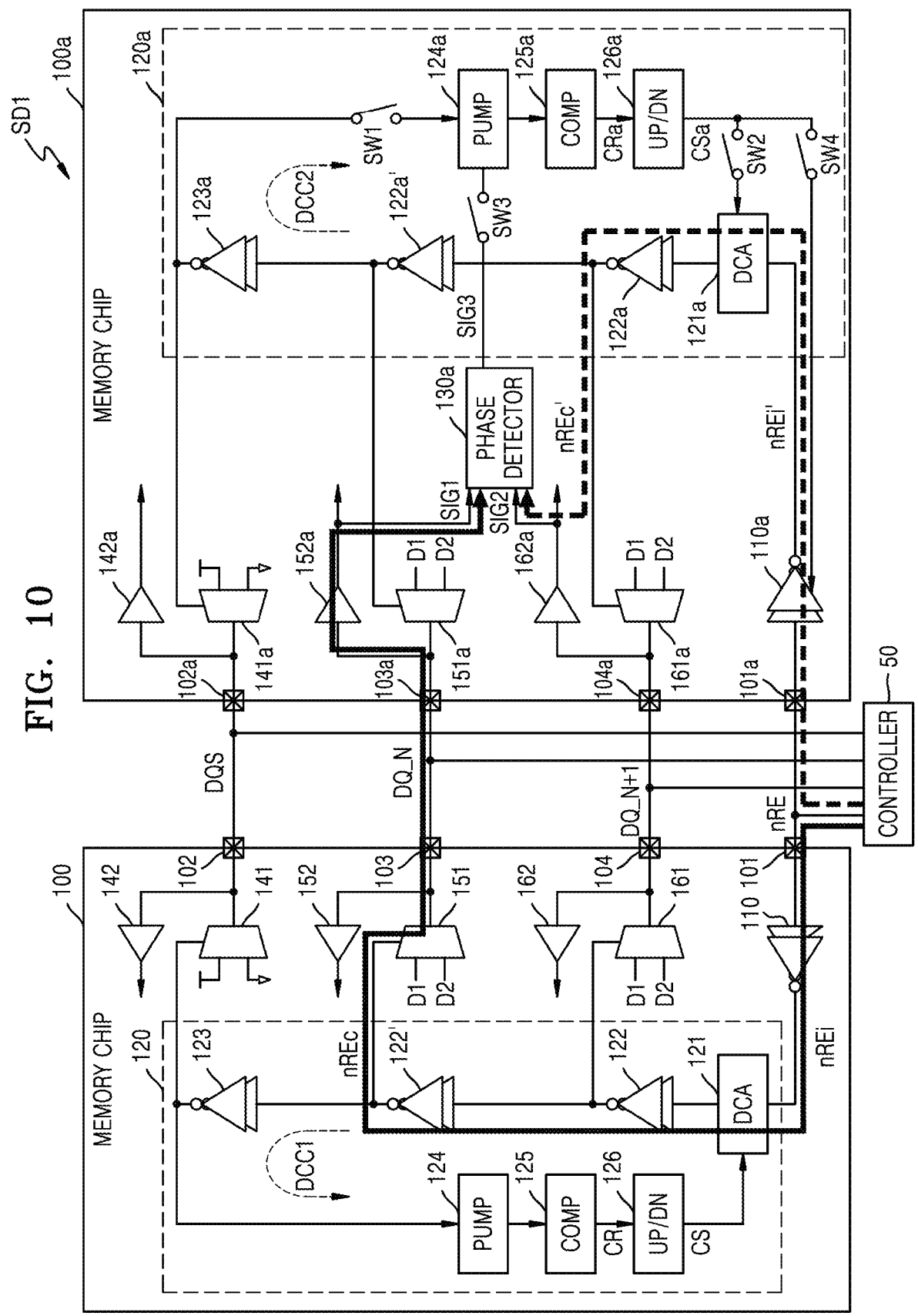
FIG. 10 is a block diagram illustrating in detail the storage device of FIG. 3 according to example embodiments of the inventive concepts.

FIG. 10 is a block diagram illustrating in detail the storage device SD1 of FIG. 3 according to example embodiments of the inventive concepts.

Referring to FIGS. 3 and 10 together, the first to fourth pads 101 to 104 of the first memory chip 100 may be respectively connected to the first to fourth pads 101a to 104a of the second memory chip 100a. For example, the first pads 101 and 101a may be commonly connected to the first pin P1 to receive the read enable signal nRE from the controller 50. For example, the second pads 102 and 102a may be commonly connected to the second pin P2 to transmit and receive a data strobe signal DQS to and from the controller 50. For example, the third pads 103 and 103a may be commonly connected to one of the third pins P3 to transmit and receive data to and from the controller 50, and the fourth pads 104 and 104a may be connected to the other one of the third pins P3 to transmit and receive data to and from the controller 50. According to some example embodiments, the third pads 103 and 103a may be referred to as Nth input-output pads, and the fourth pads 104 and 104a may be referred to as N+1th input-output pads.

The first memory chip 100 may include the delay circuit 110, the DCC 120, multiplexers 141, 151 and 161, and input buffers 142, 152 and 162. The multiplexer 141 and the input buffer 142 may be connected to the second pad 102, the multiplexer 151 and the input buffer 152 may be connected to the third pad 103, the multiplexer 161 and the input buffer 162 may be connected to the fourth pad 104. Although not shown, the first memory chip 100 may further include output buffers connected to each of the second to fourth pads 102, 103, and 104.

The delay circuit 110 may generate the first internal read enable signal nREi from the read enable signal nRE and provide the generated first internal read enable signal nREi to the DCC 120. The DCC 120 may generate the first corrected read enable signal nREc by performing a first duty correction operation DCC1 on the first internal read enable signal nREi. For example, the DCC 120 may include the DCA circuit 121, repeaters 122, 122', and 123, the charge pump 124, the comparator 125, and the up/down counter 126, and the descriptions provided above with reference to FIG. 6 may also be applied to the present example embodiments.

The multiplexer 151 may receive the first and second internal data D1 and D2, and generate the first signal SIG1 from the first and second internal data D1 and D2 according to the first corrected read enable signal nREc. The generated first signal SIG1 may be output to the third pad 103. In some example embodiments, when the first duty correction operation DCC1 on the first internal read enable signal nREi is completed, the first memory chip 100 may output the first signal SIG1 to the third pad 103.

The second memory chip 100a may include the delay circuit 110a, the DCC 120a, the phase detector 130a, multiplexers 141a, 151a, 161a, and input buffers 142a,

152a, 162a. The multiplexer 141a and the input buffer 142a may be connected to the second pad 102a, the multiplexer 151a and the input buffer 152a may be connected to the third pad 103a, and the multiplexer 161a and the input buffer 162a may be connected to the fourth pad 104a. Although not shown, the second memory chip 100a may further include output buffers respectively connected to the second to fourth pads 102a, 103a, and 104a.

The delay circuit 110a may generate the second internal read enable signal nREi' from the read enable signal nRE, and provide the generated second internal read enable signal nREi' to the DCC 120a. The DCC 120a may generate the second corrected read enable signal nREc' by performing a second duty correction operation DCC2 on the second internal read enable signal nREi'. For example, the DCC 120a may include a DCA circuit 121a, repeaters 122a, 122a', and 123a, a charge pump 124a, a comparator 125a, and an up/down counter 126a, and the descriptions provided above with reference to FIG. 6 may also be applied to the present example embodiments.

The multiplexer 161a may receive the first and second internal data D1 and D2, and generate the second signal SIG2 from the first and second internal data D1 and D2 according to the second corrected read enable signal nREc'. The generated second signal SIG2 may be output to the fourth pad 104a. In some example embodiments, when the second duty correction operation DCC2 on the second internal read enable signal nREi' is completed, the second memory chip 100a may output the second signal SIG2 to the fourth pad 104a.

The phase detector 130a may be connected to output terminals of the input buffers 152a and 162a, and may receive the first and second signals SIG1 and SIG2 from the input buffers 152a and 162a. The phase detector 130a may generate the third signal SIG3 having a duty ratio or a duty cycle according to the phase difference PD between the first and second signals SIG1 and SIG2. In some example embodiments, the phase detector 130a may be enabled after the first duty correction operation DCC1 of the first memory chip 100 and the second duty correction operation DCC2 of the second memory chip 100a are completed.

The DCC 120a may further include first to fourth switches SW1 to SW4. The first switch SW1 may be disposed between the repeater 123a and the charge pump 124a. The second switch SW2 may be disposed between the up/down counter 126a and the DCA circuit 121a. The third switch SW3 may be disposed between the phase detector 130a and the charge pump 124a. The fourth switch SW4 may be disposed between the up/down counter 126a and the delay circuit 110a. Hereinafter, the second duty correction operation DCC2 and the phase calibration operation of the second memory chip 100a according to on/off operations of the first to fourth switches SW1 to SW4 will be described in detail.

In a first period in which the second duty correction operation DCC2 of the second memory chip 100a is performed, the first and second switches SW1 and SW2 may be turned on, and the third and fourth switches SW3 and SW4 may be turned off. Accordingly, in the first period, a DCC loop for the second internal read enable signal nREi' may be formed in the DCC 120a, and the DCC 120a may generate the second corrected read enable signal nREc' by performing the second duty correction operation DCC2 on the second internal read enable signal nREi'.

In the second period in which the phase calibration operation of the second memory chip 100a is performed, the first and second switches SW1 and SW2 may be turned off, and the third and fourth switches SW3 and SW4 may be turned on. Accordingly, in the second period, a DCC loop for the third signal SIG3 may be formed. In some example embodiments, the charge pump 124a may generate a charge pump signal from the third signal SIG3 through charge pumping, and the comparator 125a may compare the charge pump signal to a reference signal and generate a comparison result signal CRa. In some example embodiments, the charge pump 124a may generate first and second charge pump signals by receiving the third signal SIG3 and an inverted third signal, and the comparator 125a may generate the comparison result signal CRa by comparing the first and second charge pump signals. The up/down counter 126a may generate a control signal CSa based on the comparison result signal CRa and provide the generated control signal CSa to the delay circuit 110a.

The delay circuit 110a may generate the second internal read enable signal nREi' by adjusting a delay time with respect to the read enable signal nRE according to the control signal CSa received from the up/down counter 126a. Accordingly, a phase of the second signal SIG2 generated from the second internal read enable signal nREi' may be the same as that of the first signal SIG1, and the phases of the first and second signals SIG1 and SIG2 may be aligned.

Figure 11:
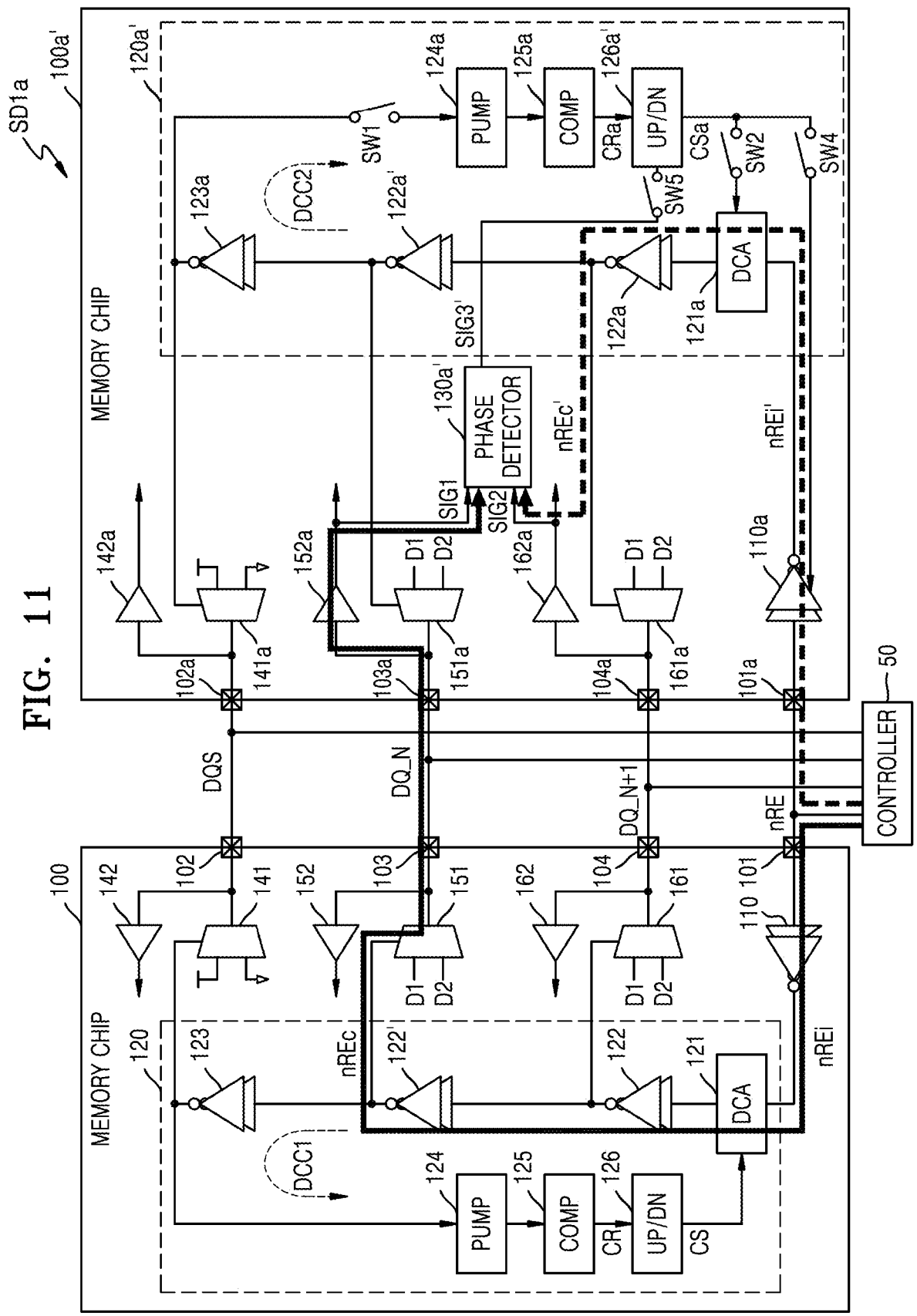
FIG. 11 is a block diagram illustrating in detail a storage device according to example embodiments of the inventive concepts.

FIG. 11 is a block diagram illustrating in detail a storage device SD1a according to example embodiments of the inventive concepts.

Referring to FIG. 11, the storage device SD1a may correspond to a modification example of the storage device SD1 of FIG. 10, and the description provided above with reference to FIG. 10 may also be applied to the present example embodiments. A second memory chip 100a' may include a DCC 120a' and a phase detector 130a'. The phase detector 130a' may generate a third signal SIG3' having a logic high level or a logic low level according to a phase difference between the first and second signals SIG1 and SIG2 and provide the generated third signal SIG3' to a up/down counter 126a'. In a second period in which a phase calibration operation of the second memory chip 100a' is performed, the first and second switches SW1 and SW2 may be turned off, and the fourth and fifth switches SW4 and SW5 may be turned on. The up/down counter 126a' may generate the control signal CSa based on the third signal SIG3' and provide the generated control signal CSa to the delay circuit 110a.

Figure 12:
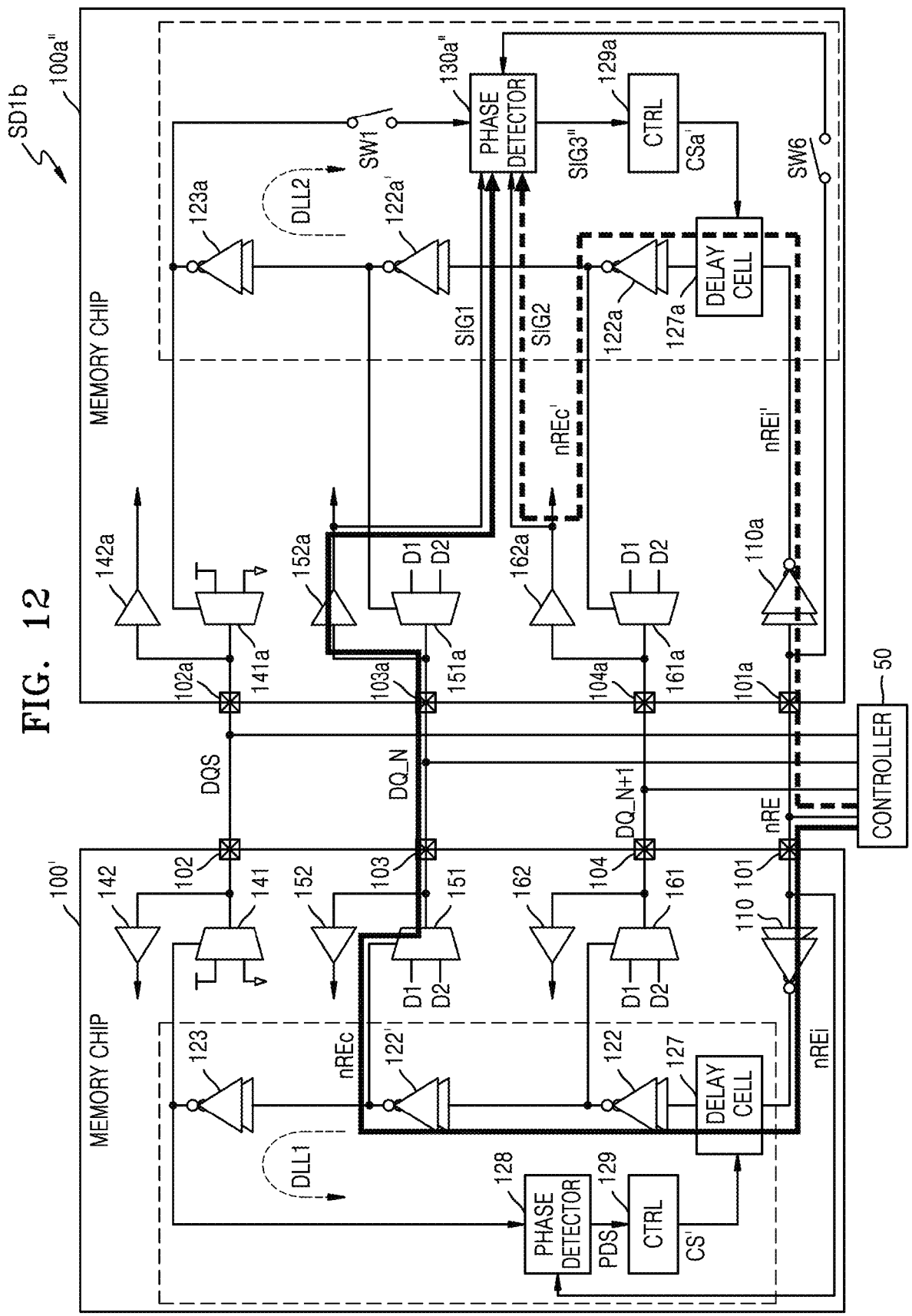
FIG. 12 is a block diagram illustrating in detail a storage device according to example embodiments of the inventive concepts.

FIG. 12 is a block diagram illustrating in detail a storage device SD1b according to example embodiments of the inventive concepts.

Referring to FIGS. 3 and 12 together, the storage device SD1b may include a first memory chip 100', a second memory chip 100a", and the controller 50. The storage device SD1b may correspond to a modification example of the storage device SD1 of FIG. 10, and the description provided above with reference to FIG. 10 may also be applied to the present example embodiments.

The first memory chip 100' may include the delay circuit 110, a delay cell 127, the repeaters 122, 122', and 123, a phase detector 128, a control circuit 129, the multiplexers 141, 151, and 161, the input buffers 142, 152, and 162, and the first to fourth pads 101 to 104. For example, the delay cell 127, the repeaters 122, 122', and 123, the phase detector 128, and the control circuit 129 may form a DLL, and accordingly, may perform a first DLL operation DLL1.

The phase detector 128 may generate a phase detection signal PDS having a logic high level or a logic low level according to a phase difference between an output signal of the repeater 123 and the read enable signal nRE. The control circuit 129 may generate a control signal CS' for controlling the delay cell 127 according to the phase detection signal PDS. The delay cell 127 may adjust a delay time with respect to the first internal read enable signal nREi according to the control signal CS'.

The second memory chip 100*a*" may include a delay circuit 110*a*, a delay cell 127*a*, repeaters 122*a*, 122*a*', and 123*a*, a phase detector 130*a*", a control circuit 129*a*, multiplexers 141*a*, 151*a*, and 161*a*, input buffers 142*a*, 152*a*, and 162*a*, first and sixth switches SW1 and SW6, and first to fourth pads 101*a* to 104*a*. For example, the delay cell 127*a*, the repeaters 122*a*, 122*a*', and 123*a*, the phase detector 130*a*", and the control circuit 129*a* may form the DLL, and accordingly, may perform a second DLL operation DLL2.

The phase detector 130*a*" may be connected to output terminals of the input buffers 152*a* and 162*a* and may receive the first and second signals SIG1 and SIG2 from the input buffers 152*a* and 162*a*. The phase detector 130*a*" may generate a third signal SIG3" having a logic high level or a logic low level according to a phase difference between the first and second signals SIG1 and SIG2. In some example embodiments, the phase detector 130*a*" may be enabled after the first DLL operation DLL1 of the first memory chip 100' and the second DLL operation DLL2 of the second memory chip 100*a*" are completed.

In a first period in which the second DLL operation DLL2 of the second memory chip 100*a*" is performed, the first and sixth switches SW1 and SW6 may be turned on. The phase detector 130*a*" may generate the third signal SIG3" having a logic high level or a logic low level according to a phase difference between an output signal of the repeater 123*a* and the read enable signal nRE. The control circuit 129*a* may generate a control signal CSa' for controlling the delay cell 127*a* according to the third signal SIG3". The delay cell 127*a* may adjust a delay time with respect to the second internal read enable signal nREi' according to the control signal CSa'.

In a second period in which a phase calibration operation of the second memory chip 100*a*" is performed, the first and sixth switches SW1 and SW6 may be turned off. The phase detector 130*a*" may generate the third signal SIG3" having the logic high level or the logic low level according to the phase difference between the first and second signals SIG1 and SIG2 received from the input buffers 152*a* and 162*a*. In some example embodiments, the control circuit 129*a* may generate the control signal CSa' from the third signal SIG3", and the delay cell 127*a* may adjust the delay time with respect to the second internal read enable signal nREi' according to the control signal CSa'. Accordingly, the phase of the second signal SIG2 generated from the output of the delay cell 127*a* may be the same as the phase of the first signal SIG1, and the phases of the first and second signals SIG1 and SIG2 may be aligned.

Figure 13:
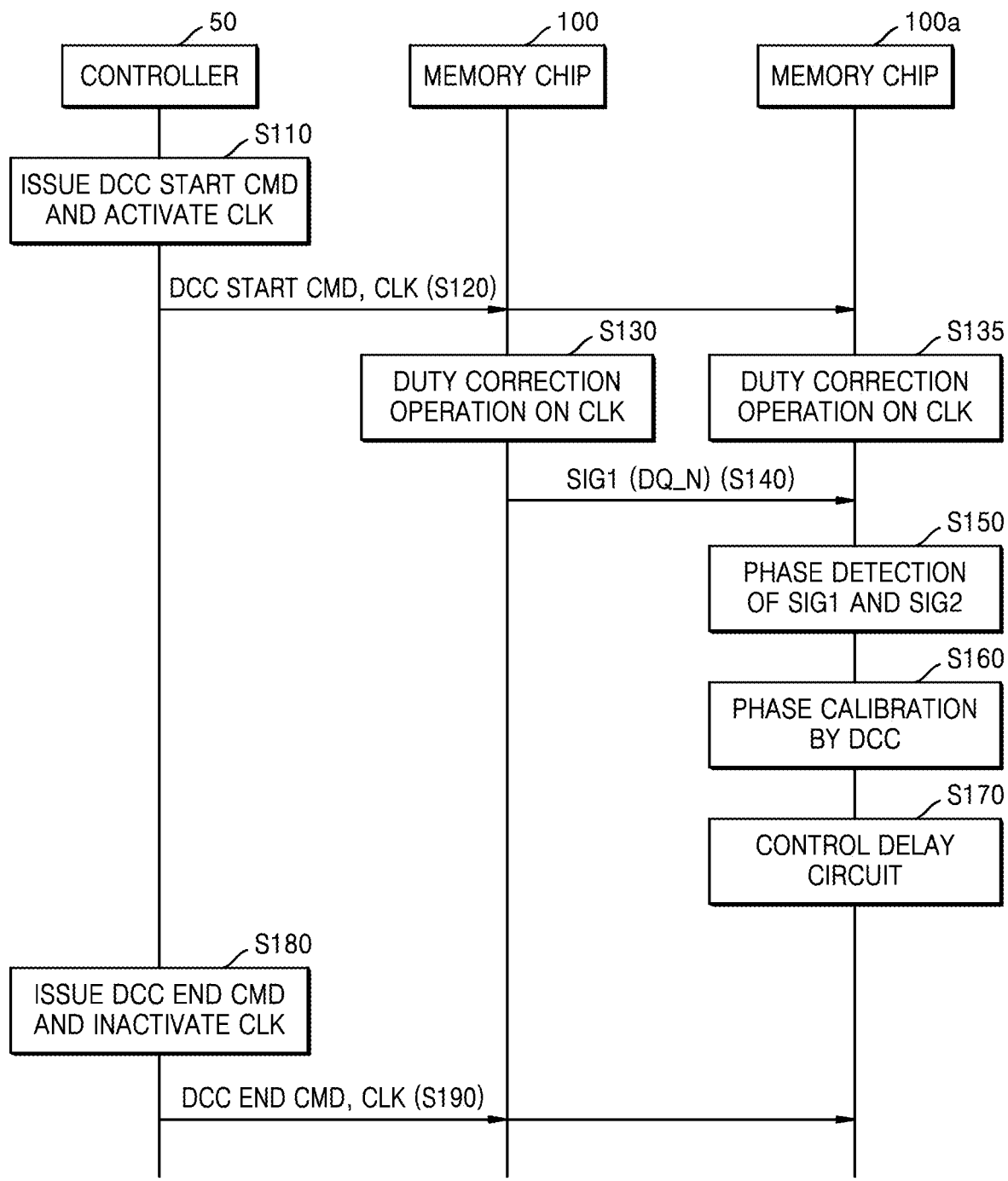
FIG. 13 is a flowchart illustrating operations of a controller and first and second memory chips according to example embodiments of the inventive concepts.

FIG. 13 is a flowchart illustrating operations of the controller 50 and the first and second memory chips 100 and 100*a* according to example embodiments of the inventive concepts.

Referring to FIG. 13, in operation S110, the controller 50 issues a DCC start command instructing initiation of DCC training, and activates the clock signal CLK. For example, the DCC start command may be implemented as a set feature command. For example, the DCC start command may correspond to a duty correction start command. For example, the clock signal CLK may be the read enable signal nRE. In operation S120, the controller 50 transmits the DCC start command and the activated clock signal CLK to the first and second memory chips 100 and 100*a*. For example, the DCC start command may be transmitted from the controller 50 to the first and second memory chips 100 and 100*a* through the third pin P3', and the clock signal CLK may be transmitted from the controller 50 to the first and second memory chips 100 and 100*a* through the first pin P1'.

In operation S130, the first memory chip 100 performs a duty correction operation on the clock signal CLK. The first memory chip 100 may generate the first signal SIG1 from the clock signal CLK as a result of performing the duty correction operation. In operation S135, the second memory chip 100*a* performs the duty correction operation on the clock signal CLK. The second memory chip 100*a* may generate the second signal SIG2 from the clock signal CLK as a result of performing the duty correction operation. In some example embodiments, operations S130 and S135 may be performed sequentially. In some example embodiments, operations S130 and S135 may be performed in parallel.

In operation S140, the first memory chip 100 transmits the first signal SIG1 to the second memory chip 100*a* through the Nth input-output pad. For example, the Nth input-output pad may correspond to an input-output pad through which the Nth data DQ_N is transmitted/received. In some example embodiments, the first signal SIG1 may correspond to a corrected clock signal generated as a result of performing the duty correction operation based on the clock signal CLK.

In operation S150, the second memory chip 100*a* detects a phase difference between the first signal SIG1 and the second signal SIG2, and generates the third signal SIG3 having a duty ratio or a duty cycle based on the phase difference. In operation S160, the second memory chip 100*a* performs a phase calibration operation based on the third signal SIG3. In operation S170, the second memory chip 100*a* controls the delay circuit 110*a*. The descriptions provided above with reference to FIGS. 10 to 12 may be applied to operations S150 to S170.

In operation S180, the controller 50 issues a DCC end command instructing the end of DCC training, and inactivates the clock signal CLK. For example, the controller 50 may determine the timing of issuing the DCC end command based on the number of previously determined clock cycles with respect to the DCC training period. For example, the DCC end command may be implemented as a set feature command. For example, the DCC end command may correspond to a duty correction end command. In operation S190, the controller 50 transmits the DCC end command and the deactivated clock signal CLK to the first and second memory chips 100 and 100*a*.

Figure 14A:
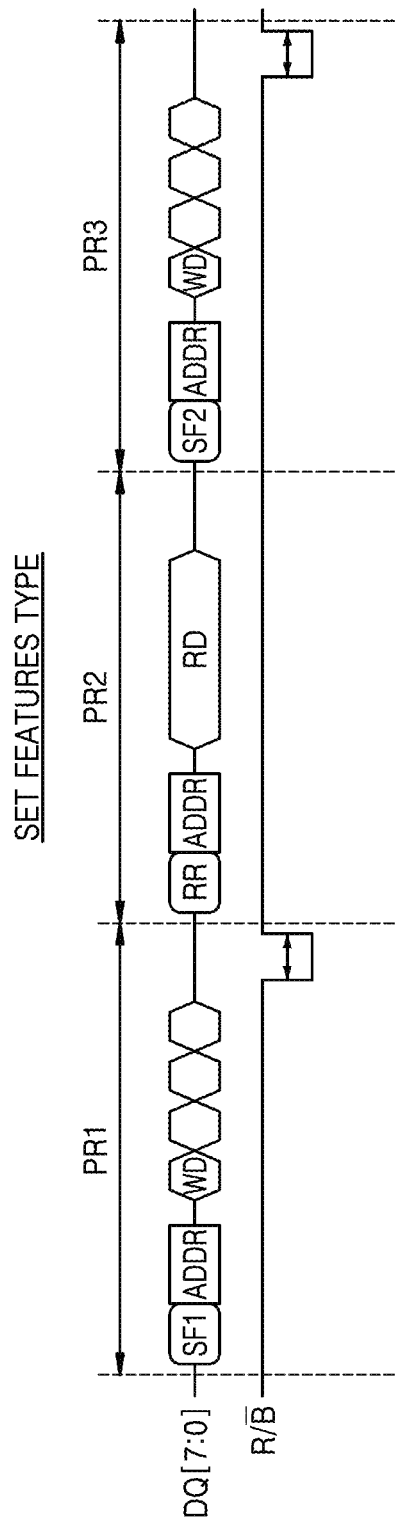
FIGS. 14A and 14B are timing diagrams illustrating duty correction sequences according to some example embodiments of the inventive concepts.
Figure 14B:
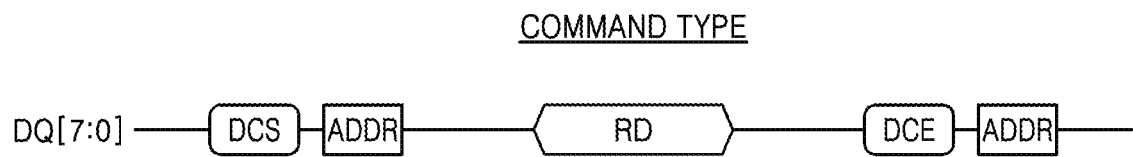

FIGS. 14A and 14B are timing diagrams illustrating duty correction sequences according to some example embodiments of the inventive concepts.

Referring to FIG. 14A, the duty correction sequence may be defined as a set features type. The controller may issue a set feature command before a normal operation of a nonvolatile memory device. For example, the set feature command is a command for setting features or operating conditions of the nonvolatile memory device. In some example embodiments, a duty correction enable sequence is initiated by receiving the set feature command. For example, the duty correction sequence may include first to third periods PR1 to PR3.

In the first period PR1, a first set feature command SF1 and an address ADDR are sequentially applied through a data line (e.g., signal lines connected to the third pin P3 in FIG. 3), and then, write data WD indicating the start of the duty correction operation may be transmitted. Operating features of the nonvolatile memory device may be modified to the duty correction sequences in the normal operation by the write data WD applied in the first period PR1. After the write data WD is transmitted, a ready/busy R/$\overline{\text{B}}$ signal may be changed to a busy state.

In the second period PR2, a random read command RR and the address ADDR are sequentially applied through the data line, and then, random read data RD may be transmitted. In some example embodiments, the nonvolatile memory device may include a random data generator, and may output random data generated by the random data generator as the random read data RD. In some example embodiments, the nonvolatile memory device may include a register, and may output data previously stored in the register as the random read data RD.

In the third period PR3, a second set feature command SF2 and the address ADDR are sequentially applied through the data line, and then, the write data WD indicating the end of the duty correction operation may be applied. Operating features of the nonvolatile memory device may be modified to normal operations in the duty correction sequence by the write data WD applied in the third period PR3. After the write data WD is transmitted, the ready/busy R/$\overline{\text{B}}$ signal may be changed to the busy state.

Referring to FIG. 14B, the duty correction sequence may be defined as a command type. First, a duty correction start command DCS and the address ADDR are sequentially applied through the data line, and accordingly, the duty correction operation may be initiated in the nonvolatile memory device, and a DCC training period may be initiated. In this regard, the duty correction start command DCS may be referred to as a duty correction enable command.

Subsequently, the random read data RD may be transmitted through the data line by DCC training. Subsequently, a duty correction end command DCE and the address ADDR are sequentially applied through the data line, and accordingly, the duty correction operation may end in the nonvolatile memory device, and the DCC training period may end. In some example embodiments, the duty correction end command DCE may be referred to as a duty correction disable command.

During the duty correction sequence illustrated in FIG. 14A or 14B, the clock signal CLK, for example, the read enable signal nRE, may be activated and toggled to a certain frequency. After the duty correction sequence is initiated, the read enable signal nRE toggles tens or hundreds of cycles according to the operating environment or the DCC capability of the nonvolatile memory device. By using the toggling of the read enable signal nRE, the DCC included in each memory chip may correct a duty mismatch that may occur in the internal read enable signal nRE, and further, a phase detector included in a target chip may perform a phase calibration operation with respect to a reference signal generated by a reference chip. After the duty correction sequence ends, the nonvolatile memory device may initiate a normal read operation or a program operation. When the duty correction sequence ends, when a clock signal is input during the normal read operation or the program operation with respect to the nonvolatile memory device, a DCC included in each memory chip may continue to provide a duty corrected clock signal.

In some example embodiments, the duty correction sequence may be performed after a power-up sequence in which power is applied to the nonvolatile memory device. In some example embodiments, the duty correction sequence may be periodically performed in an idle state of the nonvolatile memory device. In some example embodiments, the duty correction sequence may be performed in a part of a read latency period before a read-out period included in a read period of the nonvolatile memory device.

Figure 15:
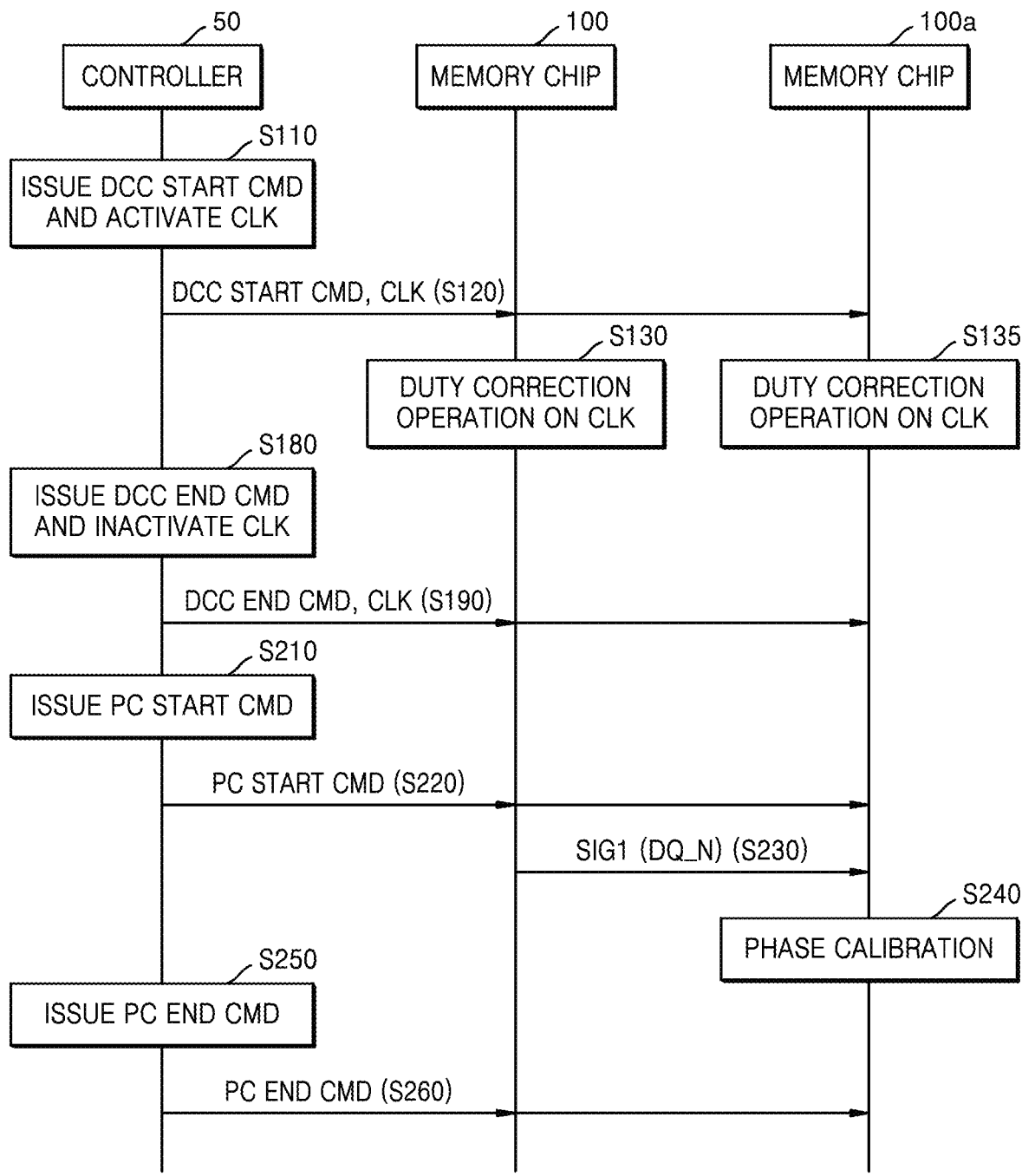
FIG. 15 is a flowchart illustrating operations of a controller and first and second memory chips according to example embodiments of the inventive concepts.

FIG. 15 is a flowchart illustrating operations of the controller 50 and the first and second memory chips 100 and 100a according to example embodiments of the inventive concepts.

Referring to FIG. 15, in operation S110, the controller 50 issues a DCC start command instructing the start of DCC training, and activates the clock signal CLK. For example, the DCC start command may be implemented as a set feature command. For example, the DCC start command may correspond to a duty correction start command. For example, the clock signal CLK may be the read enable signal nRE. In operation S120, the controller 50 transmits the DCC start command and the activated clock signal CLK to the first and second memory chips 100 and 100a. For example, the DCC start command may be transmitted from the controller 50 to the first and second memory chips 100 and 100a through the third pin P3', and the clock signal CLK may be transmitted from the controller 50 to the first and second memory chips 100 and 100a through the first pin P1'.

In operation S130, the first memory chip 100 performs a duty correction operation on the clock signal CLK. The first memory chip 100 may generate the first signal SIG1 from the clock signal CLK as a result of performing the duty correction operation. In operation S135, the second memory chip 100a performs the duty correction operation on the clock signal CLK. The second memory chip 100a may generate the second signal SIG2 from the clock signal CLK as a result of performing the duty correction operation. In some example embodiments, operations S130 and S135 may be performed sequentially. In some example embodiments, operations S130 and S135 may be performed in parallel.

In operation S180, the controller 50 issues a DCC end command instructing the end of DCC training, and inactivates the clock signal CLK. For example, the DCC end command may be implemented as a set feature command. For example, the DCC end command may correspond to a duty correction end command. In operation S190, the controller 50 transmits the DCC end command and the deactivated clock signal CLK to the first and second memory chips 100 and 100a.

In operation S210, the controller 50 issues a phase calibration PC start command instructing the start of a phase calibration operation. In operation S220, the controller 50 transmits the phase calibration PC start command to the first and second memory chips 100 and 100a. In operation S230, the first memory chip 100 transmits the first signal SIG1 to the second memory chip 100a. In operation S240, the second memory chip 100a performs the phase calibration operation. For example, operation S240 may include operations S150 to S170 of FIG. 13. In operation S250, the controller 50 issues a phase calibration PC end command instructing the end of the phase calibration operation. In operation S260, the controller 50 transmits the phase calibration PC end command to the first and second memory chips 100 and 100a.

Figure 16:
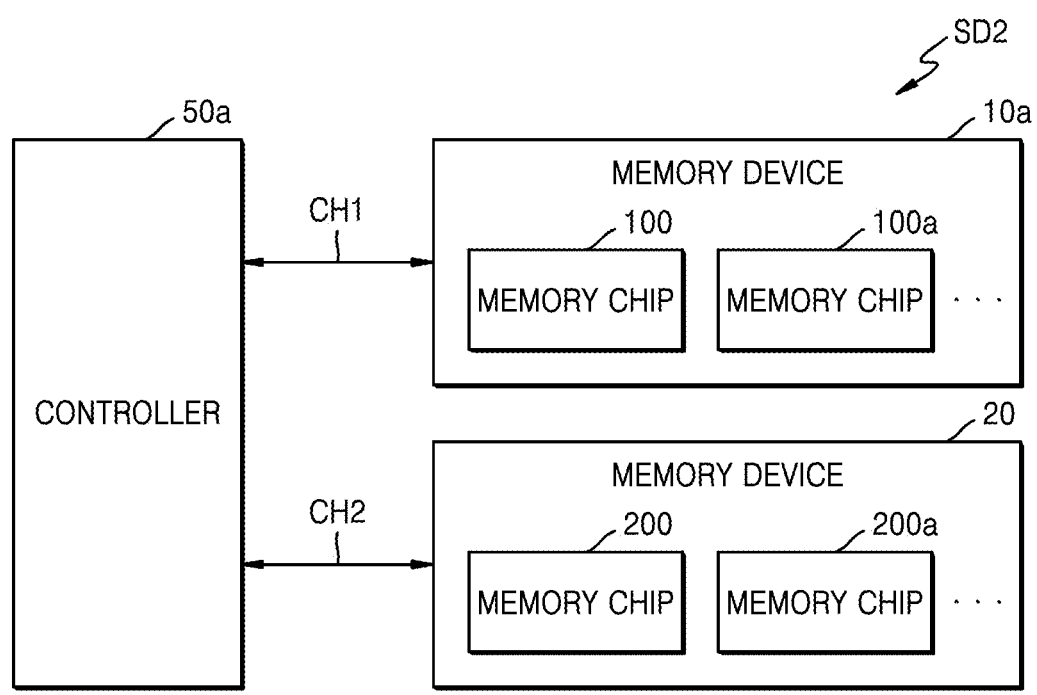
FIG. 16 is a block diagram schematically illustrating a storage device according to example embodiments of the inventive concepts.

FIG. 16 is a block diagram schematically illustrating a storage device SD2 according to example embodiments of the inventive concepts.

Referring to FIG. 16, the storage device SD2 may include first and second memory devices 10a and 20 and a controller 50a, and the first memory device 10a may be connected to the controller 50a through a first channel CH1, and the second memory device 20 may be connected to the controller 50a through a second channel CH2. The first memory device 10a may include a plurality of memory chips including at least the first and second memory chips 100 and 100*a*, and accordingly, the plurality of memory chips including the first and second memory chips 100 and 100*a* may transmit and receive data to and from the controller 50*a* through the first channel CH1. The second memory device 20 may include a plurality of memory chips including at least the first and second memory chips 200 and 200*a*, and accordingly, the plurality of memory chips including the first and second memory chips 200 and 200*a* may transmit and receive data to and from the controller 50*a* through the second channel CH2.

The plurality of memory chips included in the first memory device 10*a* may perform a phase calibration operation with respect to or on the basis of a first signal generated by the first memory chip 100, which is one of the plurality of memory chips, as illustrated in FIGS. 1 to 14, and accordingly, phases of signals generated by the plurality of memory chips of the first memory device 10*a* may be aligned. Likewise, the plurality of memory chips included in the second memory device 20 may perform the phase calibration operation with respect to or on the basis of a second signal generated by the first memory chip 200, which is one of the plurality of memory chips, as illustrated in FIGS. 1 to 14, and accordingly, phases of signals generated by the plurality of memory chips of the second memory device 20 may be aligned.

In addition, the controller 50*a* may perform the phase calibration operation based on a phase difference of the first signal received from the first memory chip 100, which is one of the plurality of memory chips connected to the first channel CH1, and the second signal received from the first memory chip 200, which is one of the plurality of memory chips connected to the second channel CH2. For example, the controller 50*a* may calibrate the phase of the second signal based on the phase of the first signal.

As described above, according to the present example embodiments, the controller 50*a* may perform the phase calibration operation between memory chips connected to the same channel. In addition, according to the present example embodiments, the controller 50*a* may perform the phase calibration operation between memory chips connected to different channels. Hereinafter, the phase calibration operation between memory chips connected to different channels will be described with reference to FIG. 17.

Figure 17:
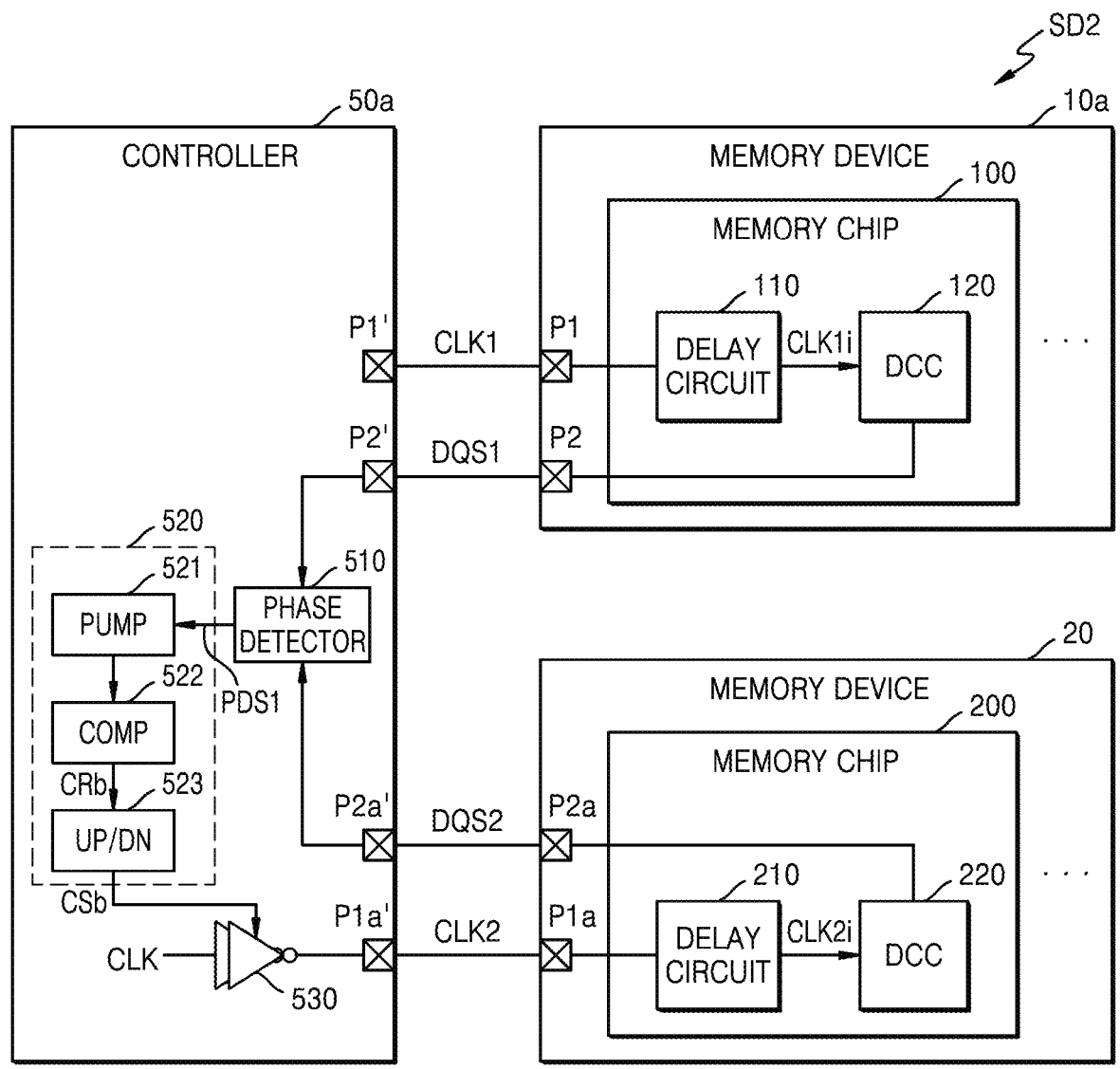
FIG. 17 illustrates the storage device of FIG. 16 in more detail.

FIG. 17 illustrates the storage device SD2 of FIG. 16 in more detail.

Referring to FIG. 17, the first memory device 10*a* may include the first and second pins P1 and P2. A plurality of memory chips including the first memory chip 100 may be commonly connected to each of the first and second pins P1 and P2. The second memory device 20 may include first and second pins P1*a* and P2*a*. A plurality of memory chips including the first memory chip 200 may be commonly connected to each of the first and second pins P1*a* and P2*a*. The controller 50*a* may include a plurality of pins P1', P2', P1*a*', and P2*a*'. The pins P1' and P2' may be respectively connected to the first and second pins P1 and P2 of the first memory device 10*a*. The pins P1*a*' and P2*a*' may be respectively connected to the first and second pins P1*a* and P2*a* of the second memory device 20.

The first memory device 10*a* may receive the first clock signal CLK1 from the controller 50*a* through the first pin P1, and transmit and receive a first data strobe signal DQS1 to and from the controller 50*a* through the second pin P2. In a DCC training period, the first memory chip 100 included in the first memory device 10*a* may perform a duty correction operation based on the first clock signal CLK1. For example, the delay circuit 110 may generate a first internal clock signal CLK1*i* from the first clock signal CLK1, and the DCC 120 may perform the duty correction operation on the first internal clock signal CLK1*i*. The result of performing the duty correction operation may be output as the first data strobe signal DQS1. The first memory device 10*a* may provide the first data strobe signal DQS1 to the controller 50*a* through the second pin P2.

The second memory device 20 may receive a second clock signal CLK2 from the controller 50*a* through the first pin P1*a*, and transmit and receive a second data strobe signal DQS2 to and from the controller 50*a* through the second pin P2*a*. In the DCC training period, the first memory chip 200 included in the second memory device 20 may perform the duty correction operation based on the second clock signal CLK2. For example, the delay circuit 210 may generate a second internal clock signal CLK2*i* from the second clock signal CLK2, and the DCC 220 may perform the duty correction operation on the second internal clock signal CLK2*i*. The result of performing the duty correction operation may be output as the second data strobe signal DQS2, and the second memory device 20 may provide the second data strobe signal DQS2 to the controller 50*a* through the second pin P2*a*.

The controller 50*a* may further include a phase detector 510, a DCC 520 and a delay circuit 530. The phase detector 510 may receive the first data strobe signal DQS1 from the first memory device 10 through the pin P2', and the second data strobe signal DQS2 from the second memory device 20 through the pin P2*a*'. The phase detector 510 may detect a phase difference between the first and second data strobe signals DQS1 and DQS2, and generate a phase detection signal PDS1 having a duty ratio or a duty cycle based on the detected phase difference.

The DCC 520 may include a charge pump 521, a comparator 522, and an up/down counter 523. The DCC 520 may be implemented substantially similar to the DCC 120' of FIG. 6, and the description provided above with reference to FIG. 6 may also be applied to the present example embodiments. In some example embodiments, the charge pump 521 may generate a charge pump signal from the phase detection signal PDS1 through charge pumping, and the comparator 522 may compare the charge pump signal to a reference signal and generate a comparison result signal CRb. In some example embodiments, the charge pump 521 may generate first and second charge pump signals by receiving the phase detection signal PDS1 and an inverted phase detection signal, and the comparator 522 may generate the comparison result signal CRb by comparing the first and second charge pump signals. The up/down counter 523 may generate a control signal CSb based on the comparison result signal CRb and provide the generated control signal CSb to the delay circuit 530. In some example embodiments, the phase detector 510 may detect a phase difference between the first and second data strobe signals DQS1 and DQS2, and generate an output signal having a logic high level or a logic low level according to the detected phase difference. The phase detector 510 may provide the generated output signal to the up/down counter 523.

The delay circuit 530 may generate the second clock signal CLK2 by adjusting a delay time with respect to the clock signal CLK according to the control signal CSb received from the up/down counter 523. Accordingly, the phase of the second clock signal CLK2 may be synchronized with, for example, the phase of the first clock signal CLK1, and as a result, the phase of the second data strobe signal DQS2 may be aligned with the phase of the first data strobe signal DQS1. Accordingly, the storage device SD2 may perform a phase calibration operation on the first and second memory devices 10a and 20 respectively connected to the different first and second channels CH1 and CH2.

In some example embodiments, the controller 50a may further include a DLL circuit, and perform the phase calibration operation using a DLL of the DLL circuit. For example, the DLL circuit of the controller 50a may receive the first and second data strobe signals DQS1 and DQS2, and the DLL circuit may control the delay circuit 53 based on a phase difference between the first and second data strobe signals DQS1 and DQS2. Accordingly, the delay circuit 530 may delay the second clock signal CLK2, and the phases of the first and second data strobe signals DQS1 and DQS2 may be aligned. At this time, the controller 50a may perform a phase calibration operation together with the DLL training operation in the DLL training period.

Figure 18:
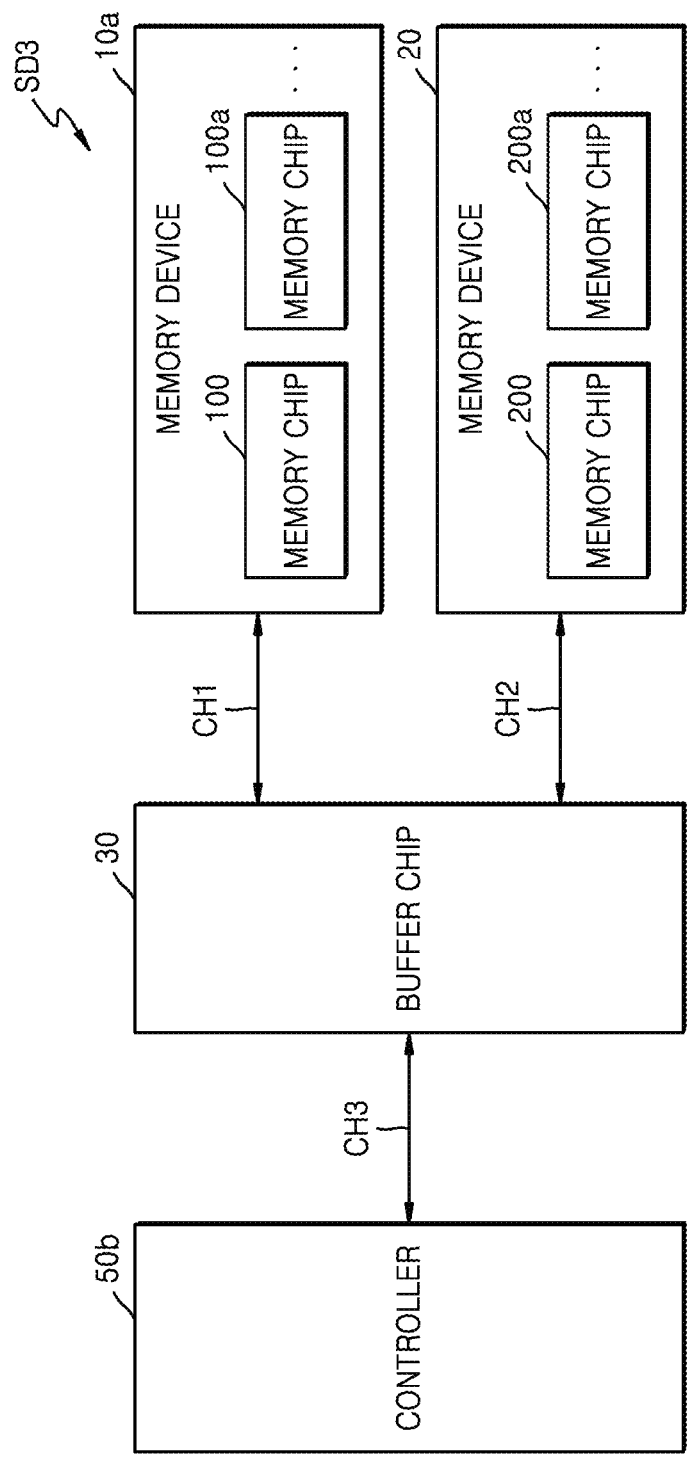
FIG. 18 is a block diagram schematically illustrating a storage device according to example embodiments of the inventive concepts.

FIG. 18 is a block diagram schematically illustrating a storage device SD3 according to example embodiments of the inventive concepts.

Referring to FIG. 18, the storage device SD3 may include the first and second memory devices 10a and 20, a buffer chip 30, and a controller 50b. The storage device SD3 according to the present example embodiments may further include the buffer chip 30 as compared to the storage device SD2 of FIG. 16. The buffer chip 30 may be connected between the controller 50b and the first and second memory devices 10a and 20, and may be referred to as a frequency boosting interface (FBI) circuit. In some example embodiments, the first and second memory devices 10a and 20 and the buffer chip 30 may be implemented as a single package, and may be referred to as a nonvolatile memory device.

The first memory device 10a may be connected to the buffer chip 30 through the first channel CH1. The second memory device 20 may be connected to the buffer chip 30 through the second channel CH2. The buffer chip 30 may be connected to the controller 50b through a third channel CH3. The first memory device 10a may include a plurality of memory chips including at least the first and second memory chips 100 and 100a, and accordingly, the plurality of memory chips including the first and second memory chips 100 and 100a may transmit and receive data to and from the buffer chip 30 through the first channel CH1. The second memory device 20 may include a plurality of memory chips including at least the first and second memory chips 200 and 200a, and accordingly, the plurality of memory chips including the first and second memory chips 200 and 200a may transmit and receive data to and from the buffer chip 30 through the second channel CH2.

The plurality of memory chips included in the first memory device 10a may perform a phase calibration operation with respect to a first signal generated by the first memory chip 100 which is one of the plurality of memory chips, as illustrated in FIGS. 1 to 14, and accordingly, phases of signals generated by the plurality of memory chips of the first memory device 10a may be aligned. Likewise, the plurality of memory chips included in the second memory device 20 may perform the phase calibration operation with respect to a second signal generated by the first memory chip 200 which is one of the plurality of memory chips, as illustrated in FIGS. 1 to 14, and accordingly, phases of signals generated by the plurality of memory chips of the second memory device 20 may be aligned.

In addition, the buffer chip 30 may perform the phase calibration operation on the first and second signals based on a phase difference of the first signal received from the first memory chip 100 which is one of the plurality of memory chips connected to the first channel CH1 and the second signal received from the first memory chip 200 which is one of the plurality of memory chips connected to the second channel CH2. For example, the buffer chip 30 may calibrate the phase of the second signal based on the phase of the first signal.

As described above, according to the present example embodiments, the buffer chip 30 may perform the phase calibration operation between memory chips connected to the same channel. In addition, according to the present example embodiments, the buffer chip 30 may perform the phase calibration operation between memory chips connected to different channels. Hereinafter, the phase calibration operation between memory chips connected to different channels will be described with reference to FIG. 19.

Figure 19:
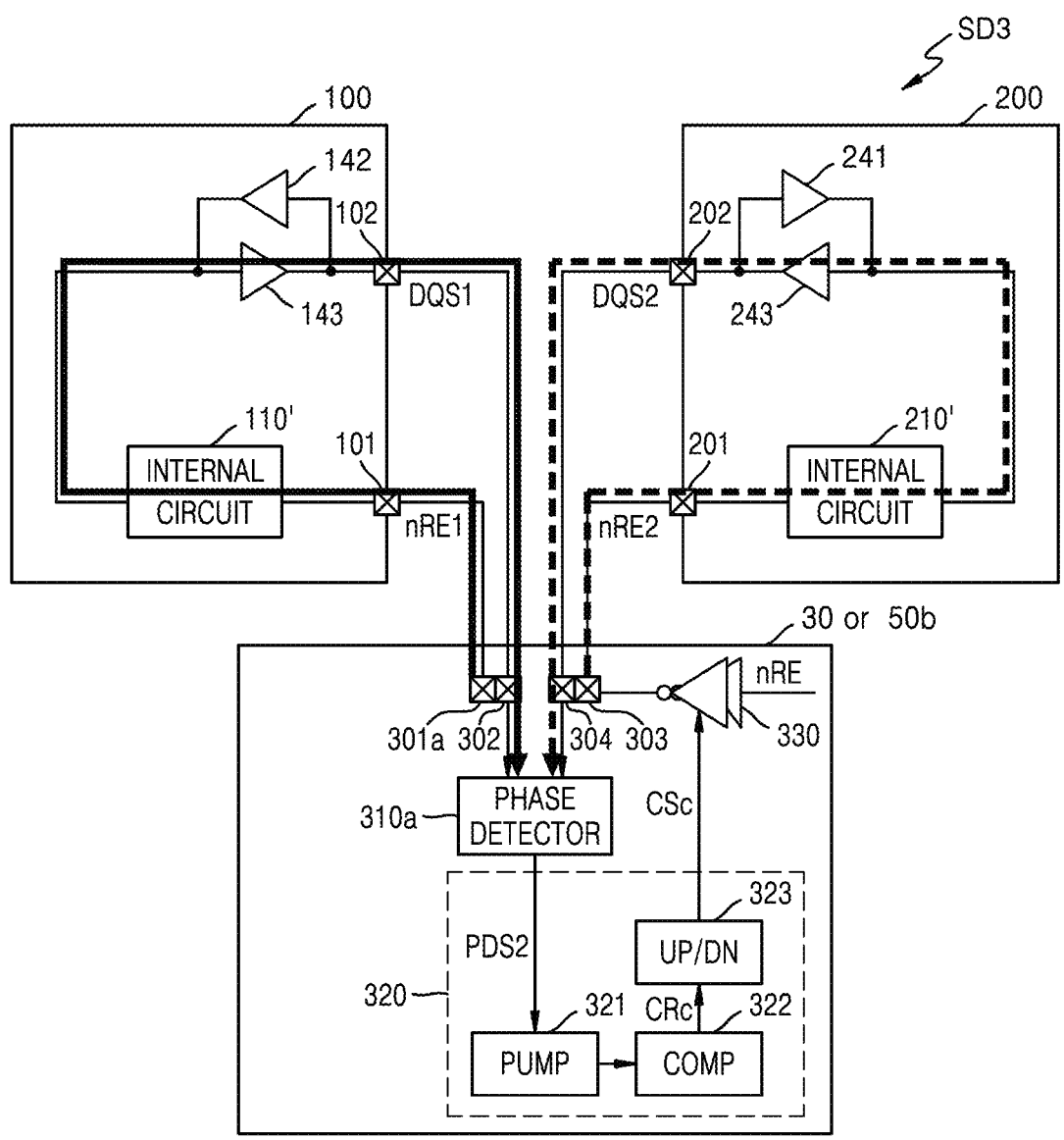
FIG. 19 illustrates in more detail the storage device of FIG. 18 according to example embodiments of the inventive concepts.

FIG. 19 illustrates in more detail the storage device SD3 of FIG. 18 according to example embodiments of the inventive concepts.

Referring to FIGS. 18 and 19, the first memory chip 100 may include an internal circuit 110', an input buffer 142, an output buffer 143, and first and second pads 101 and 102. The input buffer 142 and the output buffer 143 may be connected to the second pad 102. The internal circuit 110' may receive the first read enable signal nRE1 from the buffer chip 30 or the controller 50b through the first pad 101, and generate the first data strobe signal DQS1 from a first read enable signal nRE1. According to example embodiments, the first memory chip 100 may be implemented substantially similar to the first memory chip 100 illustrated in FIG. 10, 11, 12, or 17, and the descriptions provided above with reference to FIGS. 10 to 12 and 17 may also be applied to the present example embodiments.

The first memory chip 200 may include an internal circuit 210', an input buffer 242, an output buffer 243, and first and second pads 201 and 202. The input buffer 242 and the output buffer 243 may be connected to the second pad 202. The internal circuit 210' may receive a second read enable signal nRE2 from the buffer chip 30 or the controller 50b through the first pad 201, and generate the second data strobe signal DQS2 from the second read enable signal nRE2. The first memory chip 200 may be implemented substantially similar to the first memory chip 100 illustrated in FIG. 10, 11, 12, or 17, and the descriptions provided above with reference to FIGS. 10 to 12 and 17 may also be applied to the present example embodiments.

The buffer chip 30 or the controller 50b may include a phase detector 310a, a DCC 320, a delay circuit 330, and pads 301a to 304. The buffer chip 30 or the controller 50b may provide the first read enable signal nRE1 to the first memory chip 100 through the pad 301a, and provide the second read enable signal nRE2 to the first memory chip 200 through the pad 303. In addition, the buffer chip 30 or the controller 50b may transmit and receive the first data strobe signal DQS1 to and from the first memory chip 100 through the pad 302, and transmit and receive the second data strobe signal DQS2 to and from the first memory chip 200 through the pad 304.

The phase detector 310a may detect a phase difference between the first and second data strobe signals DQS1 and DQS2, and generate a phase detection signal PDS2 having a duty ratio or a duty cycle based on the detected phase difference. The DCC 320 may include a charge pump 321, a comparator 322 and an up/down counter 323. The DCC 320 may be implemented substantially similar to the DCC 120' of FIG. 6, and the description provided above with reference to FIG. 6 may also be applied to the present example embodiments. In some example embodiments, the charge pump 321 may generate a charge pump signal from the phase detection signal PDS2 through charge pumping, and the comparator 332 may compare the charge pump signal to a reference signal, and generate a comparison result signal CRc. In some example embodiments, the charge pump 331 may generate first and second charge pump signals by receiving the phase detection signal PDS2 and an inverted phase detection signal, and the comparator 322 may generate the comparison result signal CRc by comparing the first and second charge pump signals. The up/down counter 323 may generate a control signal CSc based on the comparison result signal CRc and provide the generated control signal CSc to the delay circuit 330.

In some example embodiments, the phase detector 310a may detect a phase difference between the first and second data strobe signals DQS1 and DQS2, and generate an output signal having a logic high level or a logic low level according to the detected phase difference. The phase detector 310a may provide the generated output signal to the up/down counter 323.

The delay circuit 330 may generate the second read enable signal nRE2 by adjusting a delay time with respect to the read enable signal nRE according to the control signal CSc received from the up/down counter 323. Accordingly, the phase of the second read enable signal nRE2 may be aligned with, for example, the phase of the first read enable signal nRE1, and as a result, the phase of the second data strobe signal DQS2 may be aligned with the phase of the first data strobe signal DQS1. Accordingly, the storage device SD3 may perform a phase calibration operation on the first and second memory devices 10a and 20 respectively connected to the different first and second channels CH1 and CH2.

In some example embodiments, the buffer chip 30 or the controller 50b may further include a DLL circuit, and perform the phase calibration operation using a DLL of the DLL circuit. For example, the DLL circuit of the buffer chip 30 or the controller 50b may receive the first and second data strobe signals DQS1 and DQS2, and the DLL circuit may control the delay circuit 330 based on a phase difference between the first and second data strobe signals DQS1 and DQS2. Accordingly, the delay circuit 330 may delay the second read enable signal nRE2, and the phases of the first and second data strobe signals DQS1 and DQS2 may be aligned. In some example embodiments, the buffer chip 30 or the controller 50b may perform the phase calibration operation together with a DLL training operation in the DLL training period.

Figure 20:
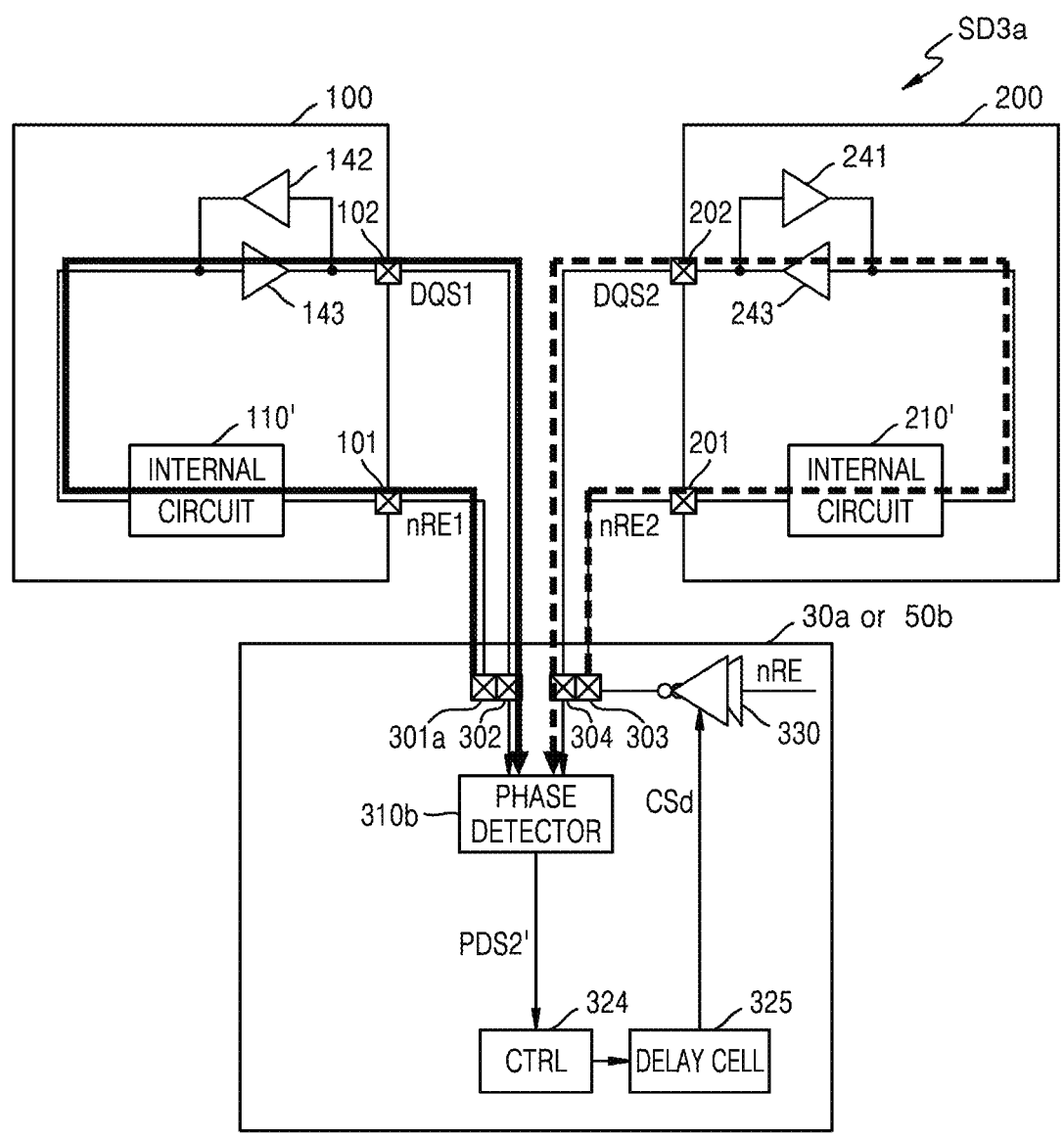
FIG. 20 illustrates in more detail a storage device according to example embodiments of the inventive concepts.

FIG. 20 schematically illustrates a storage device SD3a according to example embodiments of the inventive concepts.

Referring to FIGS. 18 and 20 together, the storage device SD3a corresponds to a modified example of the storage device SD3 of FIG. 19, and the description provided above with reference to FIG. 19 may also be applied to the present example embodiments. The storage device SD3a is different from the storage device SD3 of FIG. 19 in the configuration of the buffer chip 30a or the controller 50b. The buffer chip 30a or the controller 50b may include a phase detector 310b, a controller 324, a delay cell 325, the delay circuit 330, and the pads 301a to 304.

The phase detector 310b may detect a phase difference between the first and second data strobe signals DQS1 and DQS2, and generate a phase detection signal PDS2' having logic high or logic low according to the detected phase difference. The control circuit 324 may control the delay cell 325 based on the phase detection signal PDS2', and the delay cell 325 may provide a control signal CSd to the delay circuit 330.

The delay circuit 330 may generate the second read enable signal nRE2 by adjusting a delay time with respect to the read enable signal nRE according to the control signal CSd received from the delay cell 325. Accordingly, the phase of the second read enable signal nRE2 may be aligned with, for example, the phase of the first read enable signal nRE1, and as a result, the phase of the second data strobe signal DQS2 may be aligned with the phase of the first data strobe signal DQS1. Accordingly, the storage device SD3a may perform a phase calibration operation on the first and second memory devices 10a and 20 respectively connected to the different first and second channels CH1 and CH2.

Figure 21:
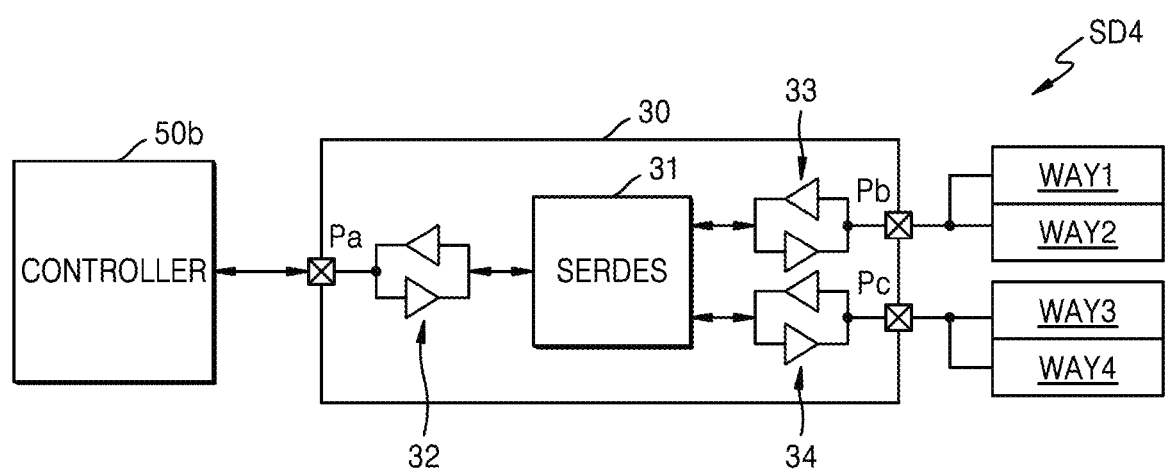
FIG. 21 schematically illustrates a storage device according to example embodiments of the inventive concepts.

FIG. 21 schematically illustrates a storage device SD4 according to example embodiments of the inventive concepts.

Referring to FIG. 21, the storage device SD4 may include first to fourth ways WAY1 to WAY4, the buffer chip 30, and the controller 50b. The storage device SD4 corresponds to a modified example of the storage device SD3 of FIG. 18, and the description provided above with reference to FIGS. 18 to 20 may also be applied to the present example embodiments.

The buffer chip 30 may include first to third pins Pa, Pb, and Pc. The buffer chip 30 may communicate with the controller 50b through the first pin Pa. For example, the buffer chip 30 may communicate with the controller 50b at 4.8 Gbps. The buffer chip 30 may communicate with the first and second ways WAY1 and WAY2 through the second pin Pb, and communicate with the third and fourth ways WAY3 and WAY4 through the third pin Pc. For example, the buffer chip 30 may communicate with the first and second ways WAY1 and WAY2 at 2.4 Gbps, and communicate with the third and fourth ways WAY3 and WAY4 at 2.4 Gbps.

In addition, the buffer chip 30 may further include a serializer/deserializer SERDES 31 and first to third input-output buffers 32, 33, and 34. The first input-output buffer 32 may be disposed between the first pin Pa and the serializer/deserializer SERDES 31. The second input-output buffer 33 may be disposed between the serializer/deserializer SERDES 31 and the second pin Pb. The third input-output buffer 34 may be disposed between the serializer/deserializer SERDES 31 and the third pin Pc. For example, the serializer/deserializer SERDES 31 may convert serial data received from the controller 50b through the first input-output buffer 32 into parallel data. In some example embodiments, the parallel data may include first data and second data. The serializer/deserializer SERDES 31 may transmit the first data to the first and second ways WAY1 and WAY2 through the second input-output buffer 33, and transmit the second data to the third and fourth ways WAY3 and WAY4 through the third input-output buffer 34.

In some example embodiments, each of the first to fourth ways WAY1 to WAY4 may be a nonvolatile memory die. In some example embodiments, each of the first to fourth ways WAY1 to WAY4 may be a nonvolatile memory chip. In some example embodiments, each of the first to fourth ways WAY1 to WAY4 may be a nonvolatile memory package. The first and second ways WAY1 and WAY2 may communicate with the buffer chip 30 through the same channel, and the third and fourth ways WAY3 and WAY4 may communicate with the buffer chip 30 through the same channel.

In some example embodiments, the buffer chip 30 may include the phase detector 310a, the DCC 320 and the delay circuit 330, as illustrated in FIG. 19, and perform a phase calibration operation on data strobe signals between the first and second ways WAY1 and WAY2 and the third and fourth ways WAY3 and WAY4. In some example embodiments, the controller 50b may include the phase detector 510, the DCC 520, and the delay circuit 530, as illustrated in FIG. 17, and perform the phase calibration operation on the data strobe signals between the first and second ways WAY1 and WAY2 and the third and fourth ways WAY3 and WAY4.

Figure 22:
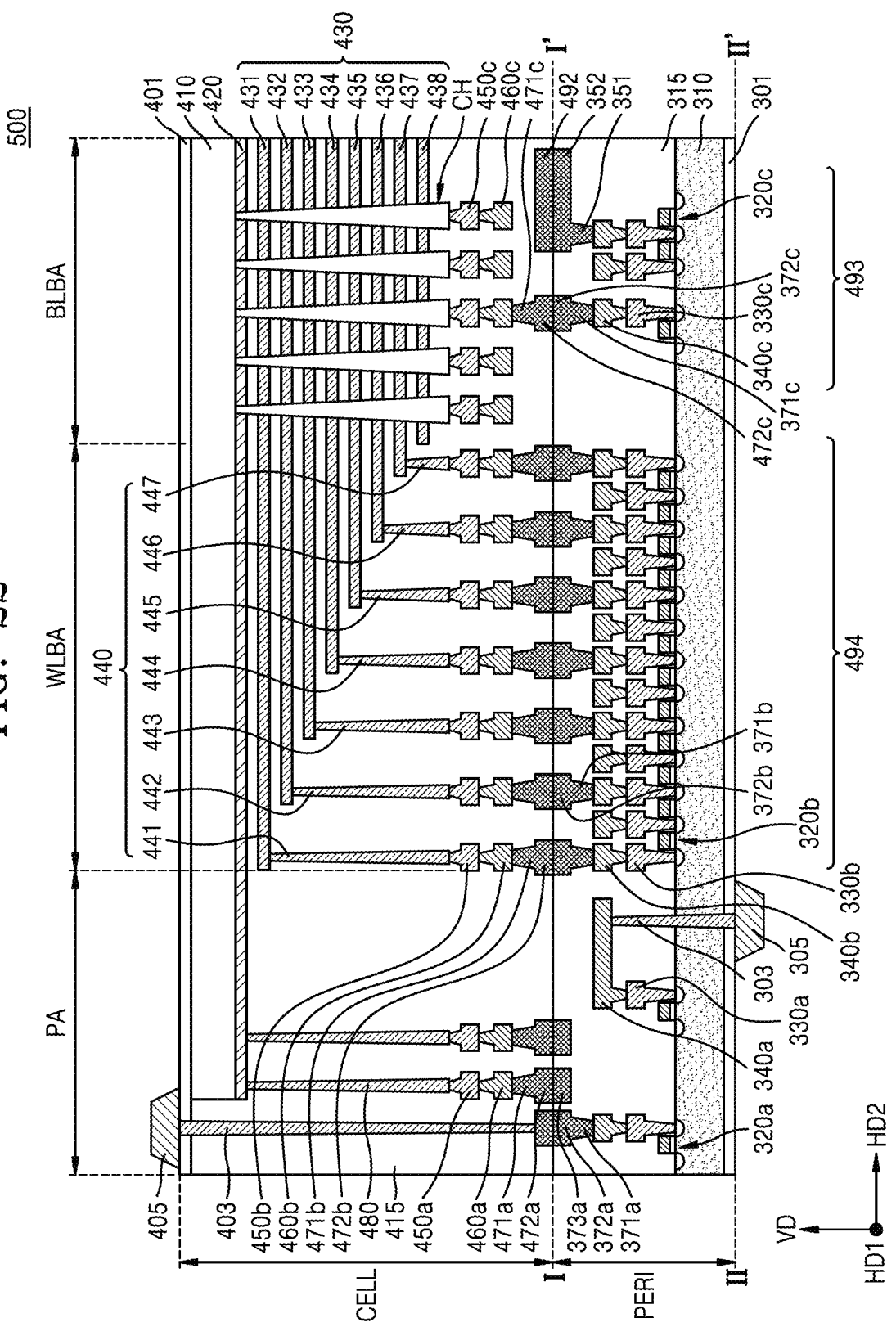
FIG. 22 illustrates a memory device according to example embodiments of the inventive concepts.

FIG. 22 illustrates a memory device 500 according to example embodiments of the inventive concepts.

Referring to FIG. 22, the memory device 500 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 500 may include an external pad bonding area PA, a word line bonding area WLBA, and a bit line bonding area BLBA. The peripheral circuit region PERI may include a first substrate 310, an interlayer insulating layer 315, a plurality of circuit elements 320a, 320b, and 320c formed on the first substrate 310, first metal layers 330a, 330b, and 330c respectively connected to the plurality of circuit elements 320a, 320b, and 320c, and second metal layers 340a, 340b, and 340c formed on the first metal layers 330a, 330b, and 330c. In some example embodiments, the first metal layers 330a, 330b, and 330c may be formed of tungsten having relatively high resistance, and the second metal layers 340a, 340b, and 340c may be formed of copper having relatively low resistance.

In the present specification, although the first metal layers 330a, 330b, and 330c and the second metal layers 340a, 340b, and 340c are shown and described, they are not limited thereto, and one or more metal layers may be further formed on the second metal layers 340a, 340b, and 340c. At least a portion of the one or more metal layers formed on the second metal layers 340a, 340b, and 340c may be formed of aluminum or the like having a lower resistance than those of copper forming the second metal layers 340a, 340b, and 340c.

The interlayer insulating layer 315 may be disposed on the first substrate 310 and cover the plurality of circuit elements 320a, 320b, and 320c, the first metal layers 330a, 330b, and 330c, and the second metal layers 340a, 340b, and 340c. The interlayer insulating layer 315 may include an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b in the peripheral circuit region PERI may be electrically connected to upper bonding metals 471b and 472b in a bonding manner, and the lower bonding metals 371b and 372b and the upper bonding metals 471b and 472b may be formed of aluminum, copper, tungsten, or the like. Further, the upper bonding metals 471b and 472b in the cell region CELL may be referred as first metal pads and the lower bonding metals 371b and 372b in the peripheral circuit region PERI may be referred as second metal pads.

The cell region CELL may include at least one memory block. The cell region CELL may include a second substrate 410 and a common source line 420. On the second substrate 410, a plurality of word lines 431 to 438 (e.g., 430) may be stacked in a direction (a Z-axis direction), perpendicular to an upper surface of the second substrate 410. At least one string select line and at least one ground select line may be arranged on and below the plurality of word lines 430, respectively, and the plurality of word lines 430 may be disposed between the at least one string select line and the at least one ground select line.

In the bit line bonding area BLBA, a channel structure CH may extend in a direction, perpendicular to the upper surface of the second substrate 410, and pass through the plurality of word lines 430, the at least one string select line, and the at least one ground select line. The channel structure CH may include a data storage layer, a channel layer, a buried insulating layer, and the like, and the channel layer may be electrically connected to a first metal layer 450c and a second metal layer 460c. For example, the first metal layer 450c may be a bit line contact, and the second metal layer 460c may be a bit line. In example embodiments, the bit line 460c may extend in a first horizontal direction HD1 parallel to the upper surface of the second substrate 410.

In example embodiments illustrated in FIG. 22, an area in which the channel structure CH, the bit line 460c, and the like are disposed may be defined as the bit line bonding area BLBA. In the bit line bonding area BLBA, the bit line 460c may be electrically connected to the circuit elements 320c providing a page buffer 493 in the peripheral circuit region PERI. For example, the bit line 460c may be connected to upper bonding metals 471c and 472c in the cell region CELL, and the upper bonding metals 471c and 472c may be connected to lower bonding metals 371c and 372c connected to the circuit elements 320c of the page buffer 493.

In the word line bonding area WLBA, the plurality of word lines 430 may extend in a second horizontal direction HD2 parallel to the upper surface of the second substrate 410, and may be connected to a plurality of cell contact plugs 441 to 447 (e.g., 440). The plurality of word lines 430 and the plurality of cell contact plugs 440 may be connected to each other in pads provided by at least a portion of the plurality of word lines 430 extending in different lengths in the second horizontal direction HD2. A first metal layer 450b and a second metal layer 460b may be connected to an upper portion of the plurality of cell contact plugs 440 connected to the plurality of word lines 430, sequentially. The plurality of cell contact plugs 440 may be connected to the circuit region PERI by the upper bonding metals 471b and 472b of the cell region CELL and the lower bonding metals 371b and 372b of the peripheral circuit region PERI in the word line bonding area WLBA.

The plurality of cell contact plugs 440 may be electrically connected to the circuit elements 320b providing a row decoder 494 in the peripheral circuit region PERI. In example embodiments, operating voltages of the circuit elements 320b providing the row decoder 494 may be different than operating voltages of the circuit elements 320c providing the page buffer 493. For example, operating voltages of the circuit elements 320c providing the page buffer 493 may be greater than operating voltages of the circuit elements 320b providing the row decoder 494.

A common source line contact plug 480 may be disposed in the external pad bonding area PA. The common source line contact plug 480 may be formed of a conductive material such as a metal, a metal compound, polysilicon, or the like, and may be electrically connected to the common source line 420. A first metal layer 450a and a second metal layer 460a may be stacked on an upper portion of the common source line contact plug 480, sequentially. For example, an area in which the common source line contact plug 480, the first metal layer 450a, and the second metal layer 460a are disposed may be defined as the external pad bonding area PA.

Input-output pads 305 and 405 may be disposed in the external pad bonding area PA. Referring to FIG. 22, a lower insulating film 301 covering a lower surface of the first substrate 310 may be formed below the first substrate 310, and a first input-output pad 305 may be formed on the lower insulating film 301. The first input-output pad 305 may be connected to at least one of the plurality of circuit elements 320a, 320b, and 320c disposed in the peripheral circuit region PERI through a first input-output contact plug 303, and may be separated from the first substrate 310 by the lower insulating film 301. In addition, a side insulating film may be disposed between the first input-output contact plug 303 and the first substrate 310 to electrically separate the first input-output contact plug 303 and the first substrate 310.

Referring to FIG. 22, an upper insulating film 401 covering the upper surface of the second substrate 410 may be formed on the second substrate 410, and a second input-output pad 405 may be disposed on the upper insulating layer 401. The second input-output pad 405 may be connected to at least one of the plurality of circuit elements 320a, 320b, and 320c disposed in the peripheral circuit region PERI through a second input-output contact plug 403.

According to some example embodiments, the second substrate 410 and the common source line 420 may not be disposed in an area in which the second input-output contact plug 403 is disposed. Also, the second input-output pad 405 may not overlap the word lines 430 in the third direction (the Z-axis direction). Referring to FIG. 22, the second input-output contact plug 403 may be separated from the second substrate 410 in a direction, parallel to the upper surface of the second substrate 410, and may pass through the interlayer insulating layer 415 of the cell region CELL to be connected to the second input-output pad 405.

According to some example embodiments, the first input-output pad 305 and the second input-output pad 405 may be selectively formed. For example, the memory device 500 may include only the first input-output pad 305 disposed on the first substrate 310 or the second input-output pad 405 disposed on the second substrate 410. Alternatively, the memory device 500 may include both the first input-output pad 305 and the second input-output pad 405.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 373a, corresponding to an upper metal pattern 472a formed in an uppermost metal layer of the cell region CELL, and having the same shape as the upper metal pattern 472a of the cell region CELL, in an uppermost metal layer of the peripheral circuit region PERI. In the peripheral circuit region PERI, the lower metal pattern 373a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 371b and 372b may be formed on the second metal layer 340b in the word line bonding area WLBA. In the word line bonding area WLBA, the lower bonding metals 371b and 372b of the peripheral circuit region PERI may be electrically connected to the upper bonding metals 471b and 472b of the cell region CELL by a Cu—Cu bonding.

Further, the bit line bonding area BLBA, an upper metal pattern 492, corresponding to a lower metal pattern 352 formed in the uppermost metal layer of the peripheral circuit region PERI, and having the same shape as the lower metal pattern 352 of the peripheral circuit region PERI, may be formed in an uppermost metal layer of the cell region CELL. A contact may not be formed on the upper metal pattern 492 formed in the uppermost metal layer of the cell region CELL.

At least one of the memory chips according to example embodiments described with reference to FIGS. 1 to 21 may be implemented in the C2C structure shown in FIG. 22. For example, the first memory chip 100 and the second memory chip 100a of FIG. 3 may be implemented in the C2C structure. In some example embodiments, the second memory chip 100a may include the memory cell region CELL including a first metal pad 471b or 472b, and the peripheral circuit region PERI including a second metal pad 371b or 372b and vertically connected to the memory cell region CELL by the first metal pad 471b or 472b and the second metal pad 371b or 372b.

The peripheral circuit region PERI may include a delay circuit that generates a second internal clock signal by delaying the clock signal, and a phase detector that detects a phase difference between first and second signals, and generates a third signal having a duty ratio according to the detected phase difference. In some example embodiments, the peripheral circuit region PERI may further include a DCC that performs a duty correction operation on the second internal clock signal and controls the delay circuit based on the third signal. In some example embodiments, the peripheral circuit region PERI may further include a control circuit that generates a control signal according to the third signal, and a delay cell that adjusts a delay time with respect to the second internal clock signal according to the control signal.

Figure 23:
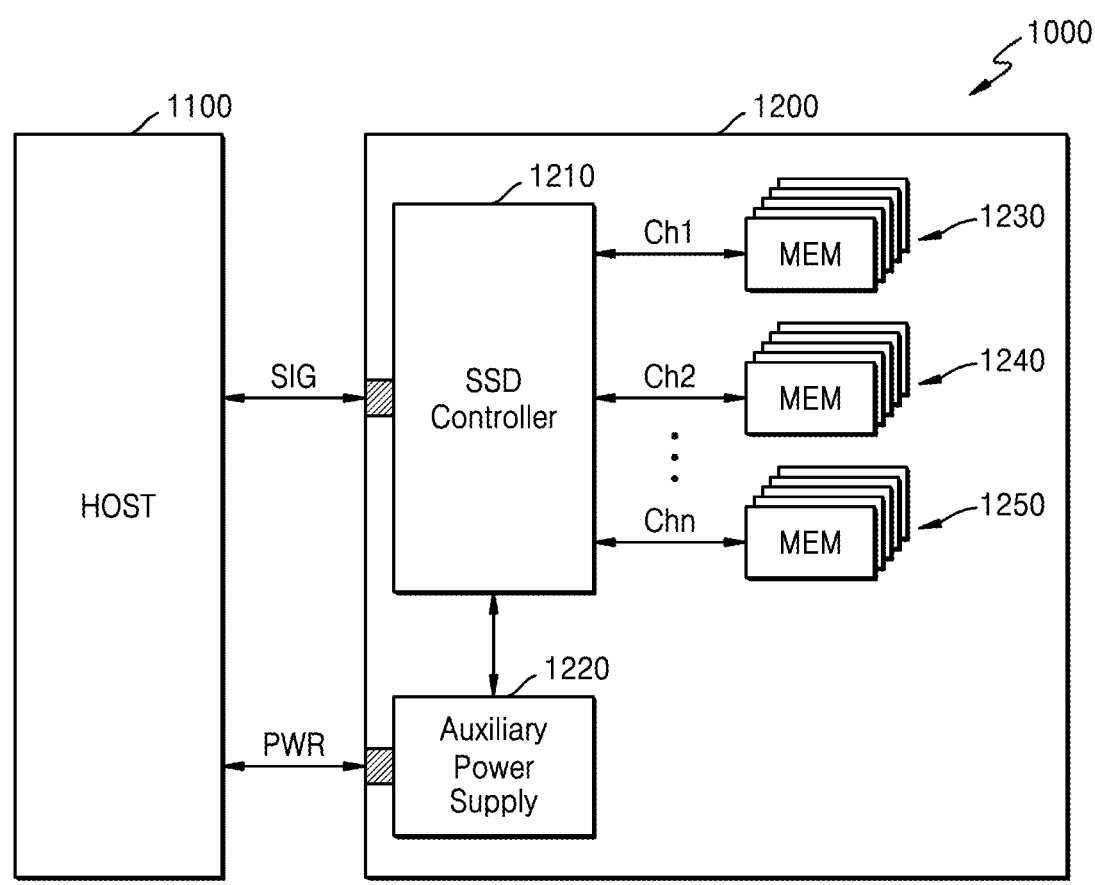
FIG. 23 is a block diagram illustrating an example of an SSD system to which a memory device is applied according to example embodiments of the inventive concepts.

FIG. 23 is a block diagram illustrating an example of an SSD system 1000 to which a memory device is applied according to example embodiments of the inventive concepts.

Referring to FIG. 23, the SSD system 1000 may include a host 1100 and an SSD 1200. The SSD 1200 exchanges signals with the host 1100 through a signal connector, and receives power through a power connector. The SSD 1200 may include an SSD controller 1210, an auxiliary power supply 1220, and memory devices 1230, 1240, and 1250. The memory devices 1230, 1240, and 1250 may be vertically stacked NAND flash memory devices. In some example embodiments, the SSD 1200 may be implemented using the example embodiments described above with reference to FIGS. 1 to 22.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A nonvolatile memory device comprising:
   a first memory chip configured to generate a first signal from a first internal clock signal based on a clock signal received from a controller; and
   a second memory chip configured to generate a second internal clock signal by delaying the clock signal and generate a second signal from the second internal clock signal, which is based on the clock signal, and perform a phase calibration operation on the second signal based on a phase difference between the first and second signals,
   wherein the first and second memory chips are connected to the controller through a same channel.

2. The nonvolatile memory device of claim 1, wherein the second memory chip comprises a first input-output pad and a second input-output pad,
   wherein the first signal is received from the first memory chip to the second memory chip through the first input-output pad, and
   wherein the second signal is provided to the second input-output pad.

3. The nonvolatile memory device of claim 2, wherein the second memory chip further comprises:
   a delay circuit configured to delay the clock signal to generate the second internal clock signal;
   a phase detector configured to detect the phase difference between the first and second signals, and generate a third signal having a duty ratio according to the detected phase difference or a logic high level or a logic low level according to the detected phase difference; and
   a duty correction circuit (DCC) configured to perform a second duty correction operation on the second internal clock signal and control the delay circuit based on the third signal.

4. The nonvolatile memory device of claim 3, wherein the second memory chip further comprises:
   a first input buffer connected to the first input-output pad and configured to buffer the first signal; and
   a second input buffer connected to the second input-output pad and configured to buffer the second signal,
   wherein the phase detector is connected to output terminals of the first and second input buffers, and configured to detect the phase difference between the first and second signals.

5. The nonvolatile memory device of claim 4, wherein the phase detector is configured to generate the third signal having a logic high level in a logic high period of the first signal or a logic high period of the second signal.

6. The nonvolatile memory device of claim 2, wherein the second memory chip further comprises:
   a delay circuit configured to delay the clock signal to generate the second internal clock signal;
   a phase detector configured to detect the phase difference between the first and second signals, and generate a third signal having a duty ratio according to the detected phase difference or a logic high level or a logic low level according to the detected phase difference;
   a control circuit configured to generate a control signal according to the third signal; and
   a delay cell configured to adjust a delay time of generating the second internal clock signal according to the control signal.

7. The nonvolatile memory device of claim 2, wherein the first memory chip comprises:
   a delay circuit configured to delay the clock signal to generate the first internal clock signal; and
   a duty correction circuit (DCC) configured to perform a first duty correction operation on the first internal clock signal,
   wherein, when the first duty correction operation is completed, the first signal is output to the first input-output pad.

8. The nonvolatile memory device of claim 1, wherein the clock signal is a read enable signal toggling at a previously determined frequency during a training period.

9. The nonvolatile memory device of claim 1, wherein the clock signal is a data strobe signal toggling at a previously determined frequency during a training period.

10. The nonvolatile memory device of claim 1, wherein the first memory chip is configured to generate the first signal by performing a first duty correction operation on the first internal clock signal, and
    the second memory chip is configured to generate the second signal by performing a second duty correction operation on the second internal clock signal.

11. The nonvolatile memory device of claim 10, wherein the second memory chip is configured to sequentially perform the second duty correction operation and the phase calibration operation in response to a duty correction circuit (DCC) start command received from the controller.

12. The nonvolatile memory device of claim 10, wherein second memory chip is configured to perform the second duty correction operation in response to a DCC start command received from the controller, and
    perform the phase calibration operation in response to a phase calibration command received from the controller.

13. A storage device comprising:
    a first memory chip configured to generate a first signal from a first internal clock signal, which is based on a first clock signal received by the first memory chip;
    a second memory chip configured to generate a second signal from a second internal clock signal, which is based on a second clock signal; and
    a controller connected to the first memory chip through a first channel, connected to the second memory chip through a second channel, and configured to perform a phase calibration operation on the second signal based on a phase difference between the first and second signals.

14. The storage device of claim 13, wherein the first memory chip is configured to generate the first signal by performing a first duty correction operation on the first internal clock signal, and
    the second memory chip is configured to generate the second signal by performing a second duty correction operation on the second internal clock signal.

15. The storage device of claim 13, wherein the first signal corresponds to a first data strobe signal generated by the first memory chip, and the second signal corresponds to a second data strobe signal generated by the second memory chip, and
the controller is configured to delay the second clock signal based on a phase difference between the first and second data strobe signals.

16. The storage device of claim 13, wherein the controller comprises:
   a phase detector configured to generate a phase detection signal according to the phase difference between the first signal received through a first pin and the second signal received through a second pin;
   a duty correction circuit (DCC) configured to generate a control signal by performing a duty correction operation on the phase detection signal; and
   a delay circuit configured to delay the second clock signal according to the control signal.

17. The storage device of claim 13, wherein the controller comprises:
   a delay circuit configured to delay a clock signal to generate the second clock signal;
   a phase detector configured to generate a phase detection signal according to a phase difference between the first signal received through a first pin and the second signal received through a second pin;
   a control circuit configured to generate a control signal according to the phase detection signal; and
   a delay cell configured to adjust a delay time with respect to the clock signal according to the control signal.

18. The storage device of claim 13, wherein the first clock signal corresponds to a first read enable signal, e d the second clock signal corresponds to a second read enable signal.

19. The storage device of claim 13, further comprising a buffer chip connected between the controller and the first and second memory chips and comprising a serializer/deserializer.

20. A nonvolatile memory device comprising:
   a first memory chip configured to generate a first signal from a first internal clock signal, which is based on a clock signal received by the first memory chip from a controller; and
   a second memory chip configured to generate a second signal from a second internal clock signal, which is based on the clock signal, and perform a phase calibration operation on the second signal based on a phase difference between the first and second signals,
   wherein the second memory chip comprises,
   a memory cell region including a first metal pad, and
   a peripheral circuit region including a second metal pad and vertically connected to the memory cell region by the first metal pad and the second metal pad, and
   wherein the peripheral circuit region comprises,
   a delay circuit configured to delay the clock signal to generate the second internal clock signal, and
   a phase detector configured to detect the phase difference between the first and second signals, and generate a third signal having a duty ratio according to the detected phase difference or a logic high level or a logic low level according to the detected phase difference.

* * * * *